US012656916B2

(12) United States Patent
Byun et al.

(10) Patent No.: US 12,656,916 B2
(45) Date of Patent: Jun. 16, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Jin-Su Byun, Yongin-si (KR); Yeongwoo Kwon, Yongin-si (KR); Sikwang Kim, Yongin-si (KR); Sanghyun Yun, Yongin-si (KR); Yang-Ho Jung, Yongin-si (KR); Gwangmin Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/075,426

(22) Filed: Mar. 10, 2025

(65) Prior Publication Data

US 2026/0086684 A1    Mar. 26, 2026

(30) Foreign Application Priority Data

Sep. 20, 2024    (KR) ........................ 10-2024-0127192

(51) Int. Cl.
*G06F 3/044*        (2006.01)
*G06F 3/041*        (2006.01)
*H10K 59/40*        (2023.01)

(52) U.S. Cl.
CPC .......... *G06F 3/0445* (2019.05); *G06F 3/0412* (2013.01); *G06F 3/0443* (2019.05); *H10K 59/40* (2023.02); *G06F 2203/04107* (2013.01)

(58) Field of Classification Search
CPC ............................................. G06F 3/044–0448
See application file for complete search history.

(56) References Cited

U.S. PATENT DOCUMENTS

| | | | |
|---|---|---|---|
| 9,354,659 B2 * | 5/2016 | Shin | G06F 1/16 |
| 10,019,126 B2 * | 7/2018 | Lee | G06F 3/0445 |
| 10,409,432 B2 * | 9/2019 | Cho | G06F 3/0445 |
| 11,626,469 B2 * | 4/2023 | Baek | G02F 1/13629 |
| | | | 257/40 |
| 11,861,116 B2 * | 1/2024 | Yoo | G06F 3/0412 |

(Continued)

FOREIGN PATENT DOCUMENTS

| | | |
|---|---|---|
| CN | 112698746 A | 4/2021 |
| CN | 113299713 A | 8/2021 |

(Continued)

*Primary Examiner* — Patrick F Marinelli
(74) *Attorney, Agent, or Firm* — F. CHAU & ASSOCIATES, LLC

(57) ABSTRACT

A display device includes a substrate, a pixel layer disposed on the substrate, an encapsulation layer disposed on the pixel layer, and a touch screen layer disposed on the encapsulation layer. The touch screen layer includes a plurality of first sensing patterns arranged in a first direction and a plurality of second sensing patterns arranged in a second direction that is different from the first direction. Each of the plurality of first sensing patterns and each of the plurality of second sensing patterns includes a plurality of touch wires. Each of the touch wires includes a first touch wire and a second touch wire disposed on the first touch wire. The display device further includes a light-shielding inclined film disposed on a side surface of the first touch wire and a side surface of the second touch wire.

15 Claims, 22 Drawing Sheets

(56)            References Cited

U.S. PATENT DOCUMENTS

| | | | |
|---|---|---|---|
| 12,321,558 B2* | 6/2025 | Shin | G06F 3/0445 |
| 2014/0333854 A1* | 11/2014 | Yang | G06F 3/0412 |
| | | | 349/12 |
| 2015/0253810 A1* | 9/2015 | Shin | G06F 3/0445 |
| | | | 345/174 |
| 2015/0253910 A1* | 9/2015 | Lee | G06F 3/047 |
| | | | 345/173 |
| 2017/0115770 A1* | 4/2017 | Han | G06F 3/0446 |
| 2022/0050542 A1* | 2/2022 | Choi | G06F 3/0412 |
| 2022/0155902 A1* | 5/2022 | Chuang | G06F 3/04164 |
| 2023/0217701 A1* | 7/2023 | Shin | H10K 59/8792 |
| | | | 345/174 |
| 2023/0229270 A1* | 7/2023 | Yoo | G06F 3/0445 |
| | | | 345/173 |
| 2024/0338100 A1* | 10/2024 | Shin | G06F 3/0446 |
| 2025/0103170 A1* | 3/2025 | Lee | G06F 3/0445 |

FOREIGN PATENT DOCUMENTS

| | | |
|---|---|---|
| CN | 115996593 A | 4/2023 |
| KR | 10-2022-0021055 A | 2/2022 |
| KR | 10-2023-0081212 A | 6/2023 |

* cited by examiner

WIN
400
TFE
200
100

10

DISPLAY DEVICE AND ELECTRONIC DEVICE INCLUDING THE SAME

CROSS-REFERENCE TO RELATED APPLICATIONS

This application claims priority under 35 U.S.C. § 119 to Korean Patent Application No. 10-2024-0127192, filed on Sep. 20, 2024, the disclosure of which is incorporated by reference herein in its entirety.

TECHNICAL FIELD

Embodiments of the present disclosure relate to a display device and electronic device including the same.

DISCUSSION OF RELATED ART

With the advancement of the information society, the demand for display devices capable of displaying images in various forms is steadily increasing. For example, display devices are widely used in various electronic devices such as smartphones, digital cameras, laptop computers, navigation devices, and smart televisions.

Moreover, research is ongoing to develop a technique for integrating touch panel functionality into display devices. By incorporating this functionality, a display device can also serve as an input device, allowing users to interact with the display device via touch, using a finger, pen, or similar tool, on its surface.

SUMMARY

Embodiments of the present disclosure provide a display device and electronic device including the same.

According to an embodiment of the present disclosure, a display device includes a substrate, a pixel layer disposed on the substrate, an encapsulation layer disposed on the pixel layer, and a touch screen layer disposed on the encapsulation layer. The touch screen layer includes a plurality of first sensing patterns arranged in a first direction and a plurality of second sensing patterns arranged in a second direction that is different from the first direction. Each of the plurality of first sensing patterns and each of the plurality of second sensing patterns includes a plurality of touch wires. Each of the touch wires includes a first touch wire and a second touch wire disposed on the first touch wire. The display device further includes a light-shielding inclined film disposed on a side surface of the first touch wire and a side surface of the second touch wire.

In some embodiments, a first insulating layer is disposed between the first touch wire and the second touch wire.

In some embodiments, the first touch wire and the second touch wire are electrically connected to each other.

In some embodiments, the light-shielding inclined film includes a first light-shielding inclined film disposed on the side surface of the first touch wire and a second light-shielding inclined film disposed on the side surface of the second touch wire.

In some embodiments, the light-shielding inclined film includes a black pigment.

In some embodiments, each of the touch wires includes a first metal layer, a third metal layer disposed on the first metal layer, and a second metal layer disposed between the first metal layer and the third metal layer.

In some embodiments, the first metal layer and the third metal layer include titanium (Ti), and the second metal layer includes aluminum (Al).

In some embodiments, the display device further includes a color filter disposed on the touch screen layer, and a light-shielding member disposed on the color filter and overlapping the touch wires.

In some embodiments, the display device further includes a color filter disposed between the touch screen layer and the encapsulation layer, and a light-shielding member disposed on the touch wires.

In some embodiments, the light-shielding inclined film covers the side surface of the first touch wire, and the light-shielding member covers the second touch wire.

According to an embodiment of the present disclosure, a display device includes a display panel including a display area and a non-display area. The non-display area is disposed at a side of the display area and includes a pad portion. The display device further includes a touch screen layer disposed on the display panel, in which the pad portion includes a plurality of pad electrodes, and at least some of the plurality of pad electrodes are electrically connected to the touch screen layer by a connection wire. The display device further includes a light-shielding inclined film disposed on a side surface of the connection wire.

In some embodiments, the touch screen layer includes a plurality of first sensing patterns arranged in a first direction and a plurality of second sensing patterns arranged in a second direction that is different from the first direction. Each of the plurality of first sensing patterns and each of the plurality of second sensing patterns includes a plurality of touch wires. The light-shielding inclined film is disposed on a side surface of each of the touch wires.

In some embodiments, each of the touch wires includes a first touch wire and a second touch wire disposed on the first touch wire and electrically connected to the first touch wire.

In some embodiments, the light-shielding inclined film includes a first light-shielding inclined film disposed on a side surface of the first touch wire and a second light-shielding inclined film disposed on a side surface of the second touch wire.

In some embodiments, each of the connection wire and each touch wire includes a first metal layer, a third metal layer disposed on the first metal layer, and a second metal layer disposed between the first metal layer and the third metal layer.

In some embodiments, the first metal layer and the third metal layer include Ti, and the second metal layer includes Al.

In some embodiments, the light-shielding inclined film includes a black pigment.

In some embodiments, the display device further includes a color filter disposed on the touch screen layer, and a light-shielding member disposed on the color filter and overlapping the touch wires.

In some embodiments, the display device further includes a color filter disposed between the touch screen layer and the display panel, and a light-shielding member disposed on the touch wires.

In some embodiments, the touch wires include a first touch wire and a second touch wire disposed on the first touch wire, the light-shielding inclined film covers the side surface of the first touch wire, and the light-shielding member covers the second touch wire.

According to an embodiment of the present disclosure, an electronic device includes a processor, a memory having stored application programs for execution by the processor, and a display device. The display device includes a substrate, a pixel layer disposed on the substrate, an encapsulation layer disposed on the pixel layer, and a touch screen layer disposed on the encapsulation layer. The touch screen layer includes a plurality of first sensing patterns arranged in a first direction and a plurality of second sensing patterns arranged in a second direction that is different from the first direction. Each of the plurality of first sensing patterns and each of the plurality of second sensing patterns includes a plurality of touch wires, and each of the touch wires includes a first touch wire and a second touch wire disposed on the first touch wire. The display device further includes a light-shielding inclined film disposed on a side surface of the first touch wire and a side surface of the second touch wire. The electronic device further includes a user interface configured to sense user input via touch or cursor select of an icon presented on the display panel, wherein the processor is caused to execute one or more of the stored application programs upon receipt of the user input.

BRIEF DESCRIPTION OF THE DRAWINGS

The above and other features of the present disclosure will become more apparent by describing in detail embodiments thereof with reference to the accompanying drawings, in which.

DETAILED DESCRIPTION

Figure 1:
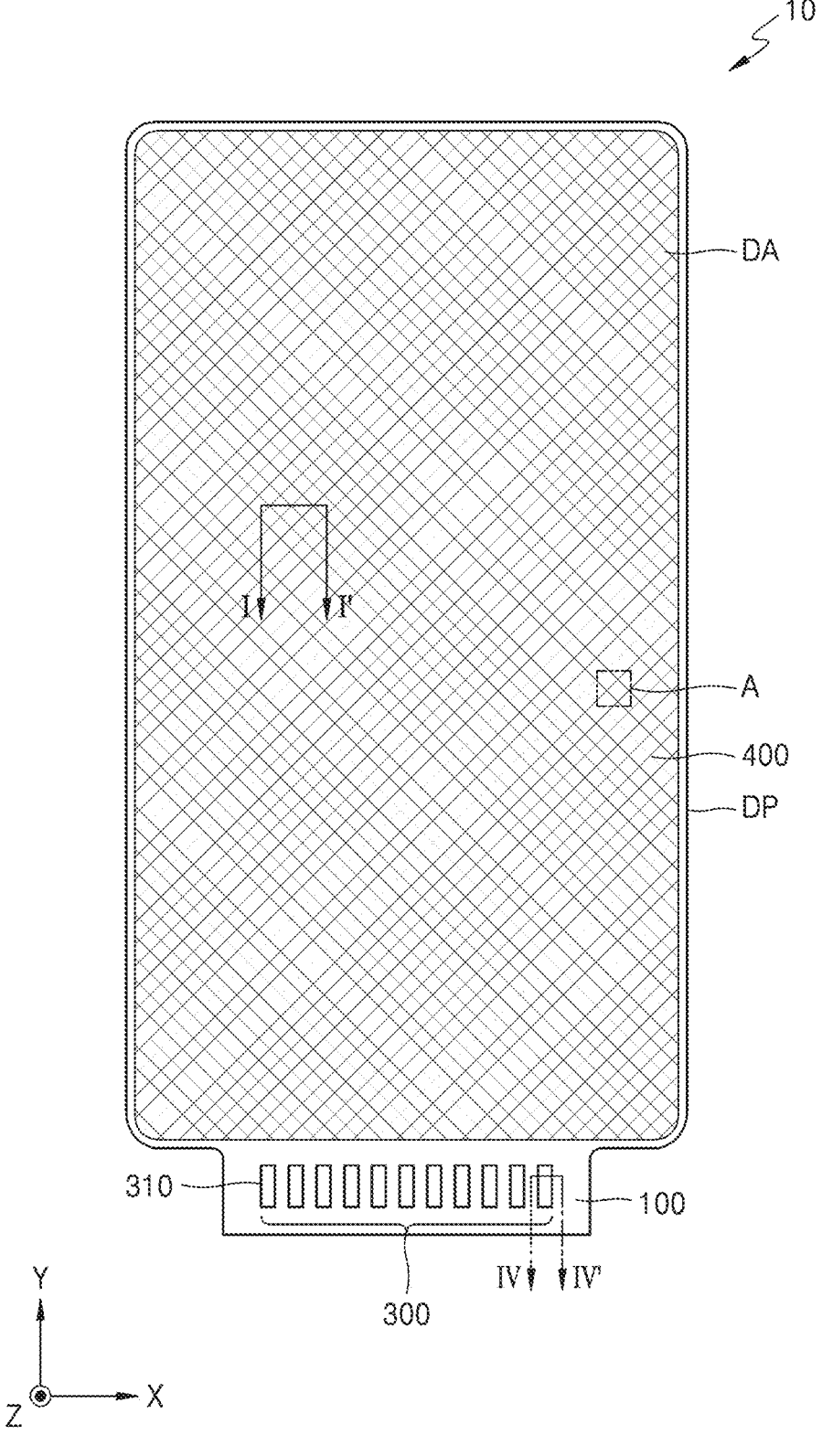
FIG. 1 is a plan view schematically showing an example of a display device according to an embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

As used herein, the term "and/or" includes any and all combinations of one or more of the associated listed items. Expressions such as "at least one of," when preceding a list of elements, modify the entire list of elements and do not modify the individual elements of the list.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, the terms "include", "have", or the like, are intended to mean that there are features, or components, described herein, but do not preclude the possibility of adding one or more other features or components.

In the examples below, terms such as connect or combine do not necessarily imply a direct and/or fixed connection or combination of two members, unless the context clearly indicates otherwise, and do not exclude the presence of another member between the two members.

Embodiments of the present disclosure relate to display devices that incorporate a light-shielding inclined film, which may address certain challenges associated with increasing RC delays in touch wires. As the demand for higher-performance display devices grows, achieving low-resistance wires often involves thicker wire layers, such as aluminum in Ti/Al/Ti structures. However, this may introduce issues such as increased side reflectance, which may affect visibility, and seam defects, which may compromise device reliability by creating risks of short circuits. Embodiments of the present disclosure address these problems through the use of a light-shielding inclined film including materials such as, for example, black pigments and organic binders (e.g., polyimide or fluorinated polybenzoxazole). This film may reduce reflectance on wire side surfaces and prevent seam defects, without requiring additional masking steps in the manufacturing process.

In addition, by incorporating touch wires and insulating layers along with the light-shielding inclined film, embodiments of the present disclosure may improve performance, durability, and usability, making a display device according to embodiments suitable for a wide range of applications, including, for example, smartphones, laptops, digital cameras, and smart TVs. This innovative approach may provide high optical quality and reliability while maintaining efficiency in the manufacturing process.

Figure 2:
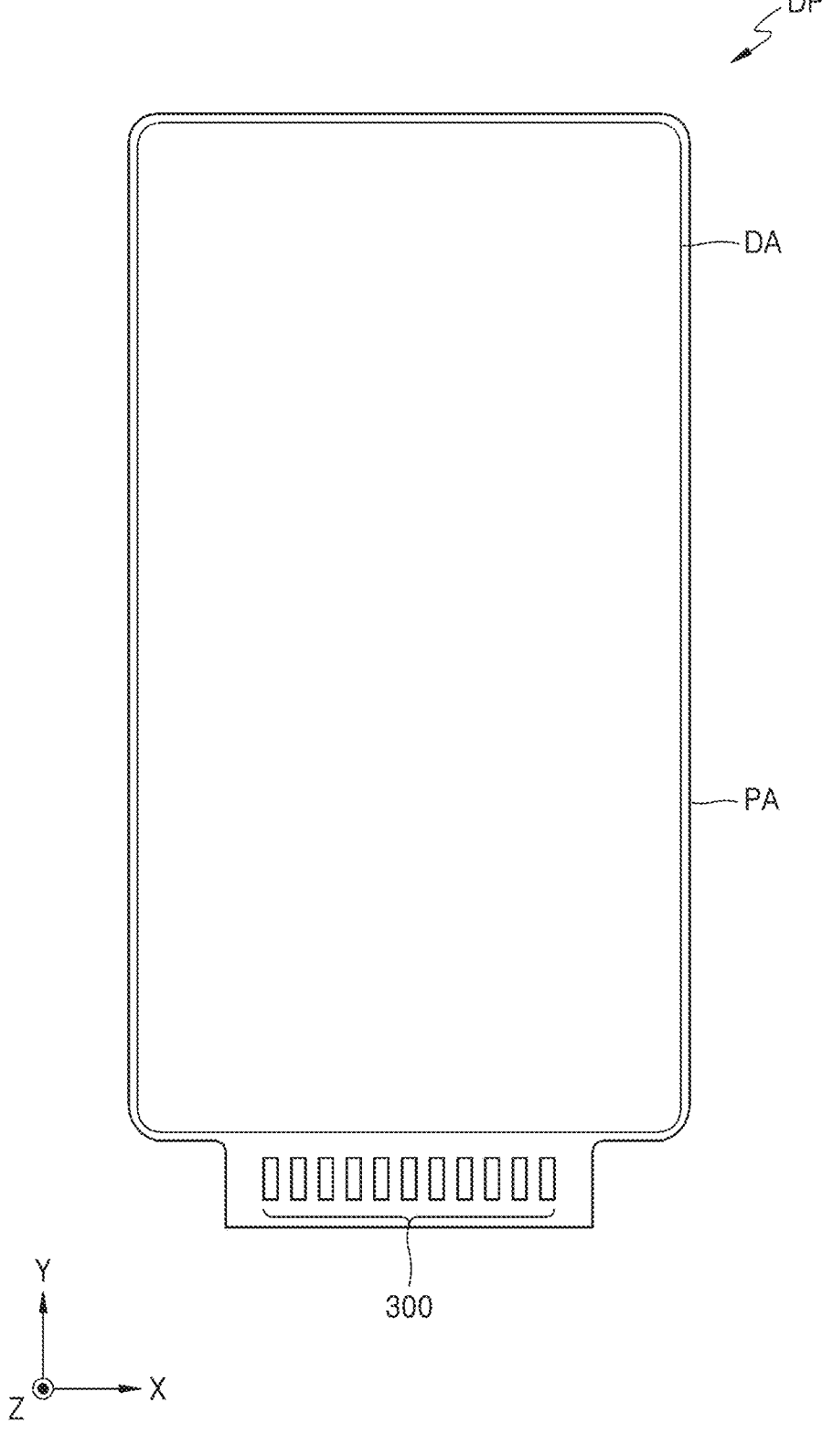
FIG. 2 is a plan view schematically showing an example of a display panel of the display device of FIG. 1.

FIG. 1 is a plan view schematically showing an example of a display device according to an embodiment of the present disclosure. FIG. 2 is a plan view schematically showing an example of a display panel of the display device of FIG. 1.

Referring to FIGS. 1 and 2, a display device 10 according to an embodiment of the present disclosure may include a display panel DP and a touch screen layer 400 disposed on the display panel DP.

The display panel DP may include a display area DA in which an image is displayed, and a non-display area PA (also referred to as a peripheral area) disposed outside of the display area DA and in which an image is not displayed. The display area DA and the non-display area PA may be included on a substrate 100.

A plurality of display elements may be disposed in the display area DA. In some embodiments, a display element may be, for example, an organic light-emitting diode (OLED), and may emit red, green, blue, or white light.

A driving unit, a power supply line, etc., may be arranged in the non-display area PA. The non-display area PA may include a pad portion 300, which is an area to which various electronic elements such as, for example, a driving integrated circuit, a printed circuit board (PCB), etc., are electrically attached.

The touch screen layer 400 may be disposed to correspond to the display area DA, may include first sensing patterns 410 (see FIG. 5) and second sensing patterns 420 (see FIG. 5) that extend in intersecting directions, and may sense a touch by an external touch input means such as, for example, a user's hand or pen to generate an input signal.

FIG. 2 is a plan view showing a state of the substrate 100 during a manufacturing process of the display panel DP. In an electronic device such as the final display panel DP or a smartphone including the display panel DP, etc., a part of the substrate 100, etc., may be bent to minimize or reduce an area of the non-display area PA recognized by a user. In some embodiments, the substrate 100 may be bent between the pad portion 300 and the display area DA such that at least a part of the pad portion 300 may be positioned to overlap the display area DA. A bending direction may be set such that the pad portion 300 is positioned behind the display area DA rather than covering the display area DA. Thus, the user may recognize that the display area DA occupies the most part of the display device 10. For example, a bezel portion corresponding to the non-display area PA may be minimized or reduced.

Left and right edges of the display area DA may be bent to have an outwardly convex shape. For example, the left and right edges of the display area DA may be curved. Thus, when the display device 10 is viewed from the front, both side edges of the display device 10 may be recognized as having no bezel, which may have the effect of expanding the display area DA.

Figure 3:
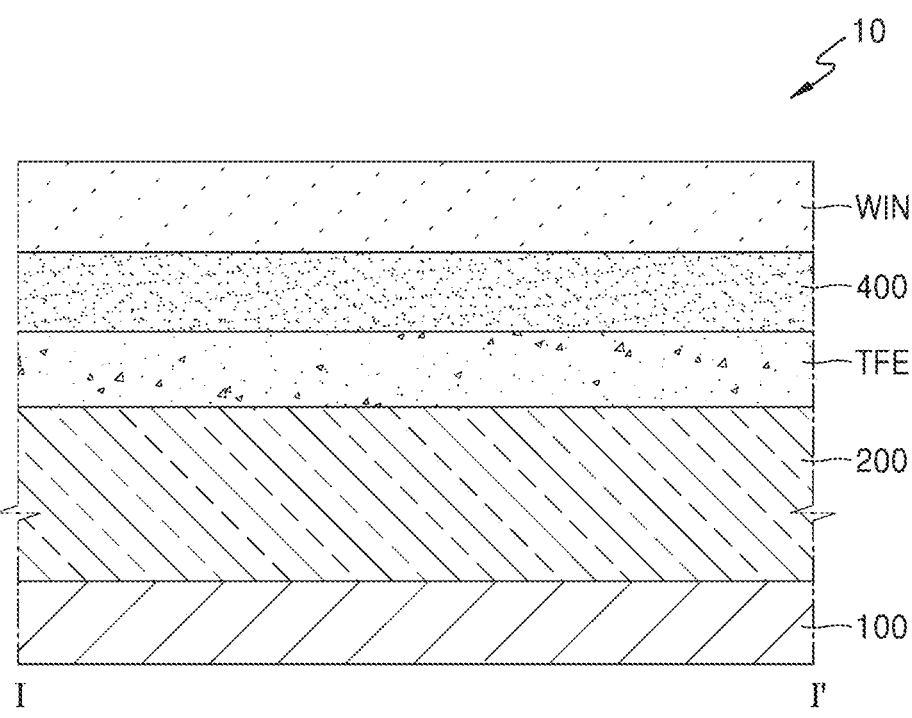
FIG. 3 is a cross-sectional view schematically showing an example of a part of a cross-section I-I' of FIG. 1.
Figure 3:
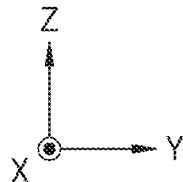
Figure 4:
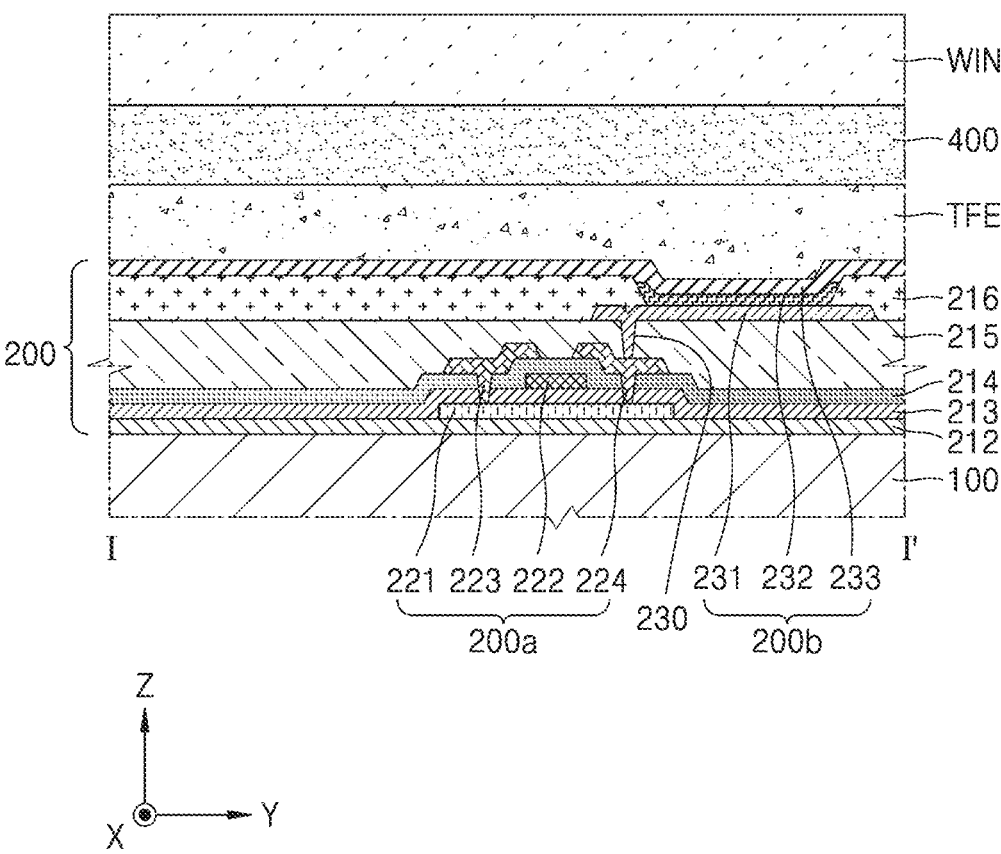
FIG. 4 is a cross-sectional view schematically showing an example of a part of a cross-section I-I' of FIG. 1.

FIG. 3 is a cross-sectional view schematically showing an example of a part of a cross-section I-I' of FIG. 1. FIG. 4 is a cross-sectional view schematically showing an example of a part of a cross-section I-I' of FIG. 1.

Referring to FIGS. 3 and 4, the display device 10 according to an embodiment of the present disclosure may implement light in a direction, for example, upwardly in the drawings.

The display device 10 may have various forms, such as a flat plate form or a bending or flexible type.

The display device 10 may be one of various types. In some embodiments, the display device 10 may be a display device such as an organic light-emitting display (OLED) device, an inorganic light-emitting display device, or a quantum dot light-emitting display device. Herein, a description will be made using an organic light-emitting display device as an example. The display device 10 may be implemented with various types of electronic devices such as, for example, mobile phones, laptop computers, smart watches, etc.

The display device 10 may include the substrate 100, a pixel layer 200 disposed on the substrate 100, an encapsulation layer TFE encapsulating the pixel layer 200, and a touch screen layer 400 disposed on the encapsulation layer TFE. A cover layer WIN (also referred to as a window) may be further disposed on the touch screen layer 400.

The substrate 100 may be formed using various materials. In some embodiments, the substrate 100 may be formed of a transparent glass material having $SiO_2$ as a main component. The substrate 100 may be formed of a plastic material having flexibility. In some embodiments, the substrate 100 may include, for example, polyesthersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose triacetate (TAC), cellulose acetate propionate (CAP), etc.

When the display device 10 is of a bottom emission type in which an image is implemented toward the substrate 100, the substrate 100 is formed of a transparent material. However, when the display device 10 is of a top emission type in which an image is implemented toward the encapsulation layer TFE, the substrate 100 can instead formed of an opaque metal having flexibility. When the substrate 100 is formed of metal, the substrate 100 may include at least one of, for example, iron, chromium, manganese, nickel, titanium, molybdenum, stainless steel (SUS), an invar alloy, an Inconel alloy, and a Kovar alloy. The substrate 100 may also be formed of a metal foil.

The pixel layer 200 may be formed on the substrate 100 and display an image. The pixel layer 200 may include, for example, a thin-film transistor 200a and an organic light-emitting element 200b. However, the present disclosure is not limited thereto. For example, in some embodiments, the pixel layer 200 may also include various types of display elements. The pixel layer 200 will be described in more detail below with reference to FIG. 4.

A buffer layer 212 may be formed on the substrate 100. The buffer layer 212 may provide a flat surface on the substrate 100 while preventing impurity elements from penetrating the substrate 100, and may be formed of various materials capable of playing such a role. In some embodiments, the buffer layer 212 may include inorganic materials such as, for example, silicon oxide, silicon nitride, silicon oxynitride, aluminum oxide, aluminum nitride, titanium oxide, titanium nitride, etc., organic materials such as polyimide, polyester, acrylic, etc., and may include a plurality of laminates among the above-described materials.

The thin-film transistor 200a may be formed on the substrate 100. The thin-film transistor 200a may include an active layer 221, a gate electrode 222, a source electrode 223, and a drain electrode 224.

The active layer 221 may be formed of an inorganic semiconductor, such as, e.g., silicon, or an organic semiconductor. The active layer 221 may include a source region, a drain region, and a channel region disposed therebetween. In some embodiments, when the active layer 221 is formed using amorphous silicon, an amorphous silicon layer may be formed on a front surface of the substrate 100 and crystallized to form and pattern a polycrystalline silicon layer, and the source region and the drain region at the edge may be doped with impurities to form the active layer 221 including the source region, the drain region, and the channel region therebetween.

A gate insulating film 213 may be formed on the active layer 221. The gate insulating film 213 may insulate the active layer 221 and the gate electrode 222 and may be formed of an inorganic material such as, for example, SiNx, SiO$_2$, etc.

The gate electrode 222 may be formed in a predetermined region on the gate insulating film 213. The gate electrode 222 may be connected to a gate line that applies an on/off signal of the thin-film transistor 200a. The gate electrode 222 may contain, for example, Au, Ag, Cu, Ni, Pt, Pd, Al, Mo, and an alloy such as, for example, an Al:Nd alloy, a Mo:W alloy, etc., but the present disclosure is not limited thereto. For example, the gate electrode 22 may be formed of various materials based on design conditions.

An interlayer insulating film 214 formed on the gate electrode 222 may provide insulation between the gate electrode 222 and the source electrode 223 and between the gate electrode 222 and the drain electrode 224, and may be formed of an inorganic material such as, e.g., SiNx, SiO$_2$, etc.

The source electrode 223 and the drain electrode 224 may be formed on the interlayer insulating film 214. In some embodiments, the interlayer insulating film 214 and the gate insulating film 213 may expose the source region and the drain region of the active layer 221, and the source electrode 223 and the drain electrode 224 may contact the exposed source region and drain region of the active layer 221.

The source electrode 223 and the drain electrode 224 may be formed as a single layer or multiple layers of one or more materials among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

Although FIG. 4 shows the thin-film transistor 200a of a top gate type sequentially including the active layer 221, the gate electrode 222, the source electrode 223, and the drain electrode 224, the present disclosure is not limited thereto. For example, in some embodiments, the gate electrode 222 may be disposed under the active layer 221.

The thin-film transistor 200a may be electrically connected to the organic light-emitting element 200b and may apply a signal for driving the organic light-emitting element 200b to the organic light-emitting element 200b. The thin-film transistor 200a may be protected by being covered with a planarization film 215.

The planarization film 215 may be an inorganic insulating film and/or an organic insulating film. The inorganic insulating film may include, for example, SiO$_2$, SiNx, SiON, Al$_2$O$_3$, TiO$_2$, Ta$_2$O$_5$, HfO$_2$, ZrO$_2$, BST, PZT, etc., and the organic insulating film may include, for example, general purpose polymers (PMMA, PS), polymer derivatives with phenolic groups, acrylic polymers, imide polymers, aryl ether polymers, amide polymers, fluorine polymers, p-xylene polymers, vinyl alcohol polymers, blends thereof, etc. The planarization film 215 may be formed of complex laminates of inorganic insulating films and organic insulating films.

The organic light-emitting element 200b may be formed on the planarization film 215. The organic light-emitting element 200b may include a pixel electrode 231, an intermediate layer 232, and a counter electrode 233.

The pixel electrode 231 may be formed on the planarization film 215, and may be electrically connected to the drain electrode 224 through a contact hole 230 formed in the planarization film 215.

The pixel electrode 231 may be a reflective electrode, and may include a reflective film formed of, for example, Ag, Mg, Al, Pt, Pd, Au, Ni, Nd, Ir, Cr, a compound thereof, etc., and a transparent or semi-transparent electrode layer formed on the reflective film. The transparent or semi-transparent electrode layer may include at least one of, for example, indium tin oxide (ITO), indium zinc oxide (IZO), zinc oxide (ZnO), indium oxide (In$_2$O$_3$), indium gallium oxide, and aluminum zinc oxide (AZO).

The counter electrode 233 disposed to oppose the pixel electrode 231 may be a transparent or semi-transparent electrode, and may be formed as a metal thin-film with a small work function, including, e.g., Li, Ca, LiF/Ca, LiF/Al, Al, Ag, Mg, and a compound thereof. An auxiliary electrode layer or a bus electrode may be further formed of a material for forming a transparent electrode, such as ITO, IZO, ZnO, In$_2$O$_3$, etc., on the metal thin-film.

Thus, the counter electrode 233 may transmit light emitted from an organic light-emitting layer included in the intermediate layer 232. That is, light emitted from the organic light-emitting layer may be reflected directly or by the pixel electrode 231 including a reflective electrode and thus discharged toward the counter electrode 233.

However, the pixel layer 200 according to an embodiment is not limited to a top emission type. For example, in some embodiments, the pixel layer 200 may be a bottom emission type in which light emitted from the organic light-emission layer is discharged toward the substrate 100. In this case, the pixel electrode 231 may include a transparent or semi-transparent electrode, and the counter electrode 233 may include a reflective electrode. The pixel layer 200 according to an embodiment may be of a double-surface light-emission type in which light is discharged in double directions including toward a top surface and a bottom surface.

A pixel-defining film 216 may be formed of an insulation material on the pixel electrode 231. The pixel-defining film 216 may be formed of one or more organic insulation materials including, for example, polyimide, polyamide, acrylic resin, benzocyclobutene, and phenolic resin, by using a method such as, e.g., spin coating, etc. The pixel-defining film 216 may expose a predetermined region of the pixel electrode 231, and the intermediate layer 232 including the organic light-emitting layer may be positioned in the exposed region.

The organic light-emitting layer included in the intermediate layer 232 may be a low-molecular organic material or a high-molecular organic material, and the intermediate layer 232 may selectively include a function layer such as, for example, a hole transport layer (HTL), a hole injection layer (HIL), an electron transport layer (ETL), etc., in addition to the organic light-emitting layer.

The encapsulation layer TFE may be disposed on the counter electrode 233. The encapsulation layer TFE may be formed to globally cover the pixel layer 200, thereby preventing external moisture and oxygen from penetrating the pixel layer 200. For example, the encapsulation layer TFE may entirely cover/encapsulate the pixel layer 200. The encapsulation layer TFE may be formed to have an area greater than an area of the pixel layer 200 so as to contact the substrate 100 at all edges thereof, thereby more firmly blocking penetration of outside air.

The encapsulation layer TFE may be formed as various types. In an embodiment, the encapsulation layer TFE may be formed of a transparent glass material having $SiO_2$ as a main component. In an embodiment, the encapsulation layer TFE may be formed of a plastic material capable of transmitting light. In an embodiment, the encapsulation layer TFE may be formed using an organic film or an inorganic film. In an embodiment, the encapsulation layer TFE may be formed by laminating one or more organic films and one or more inorganic films, and in this case, may be formed by alternately laminating the organic films and the inorganic films.

The touch screen layer 400 and the cover layer WIN, which protects the touch screen layer 400, may be disposed on the encapsulation layer TFE.

The touch screen layer 400 may be, for example, of a capacitive type, and when the cover layer WIN is touched, a capacitance change may occur between sensing patterns 410 and 420 (see FIG. 5) of the touch screen layer 400 and the counter electrode 233 and may be sensed to determine whether a corresponding portion is touched. The touch screen layer 400 will be described in further detail below.

The cover layer WIN, which may be flexible, may be formed of, for example, polymethyl methacrylate, polydimethylsiloxane, polyimide, acrylate, polyethylene terephthalate, polyethylene naphthalate, etc. However, the present disclosure is not limited thereto. For example, in some embodiments, the cover layer WIN may be formed of various materials such as a metal material, etc., or may be formed using a thin metal foil such as, e.g., stainless steel (SUS).

Figure 5:
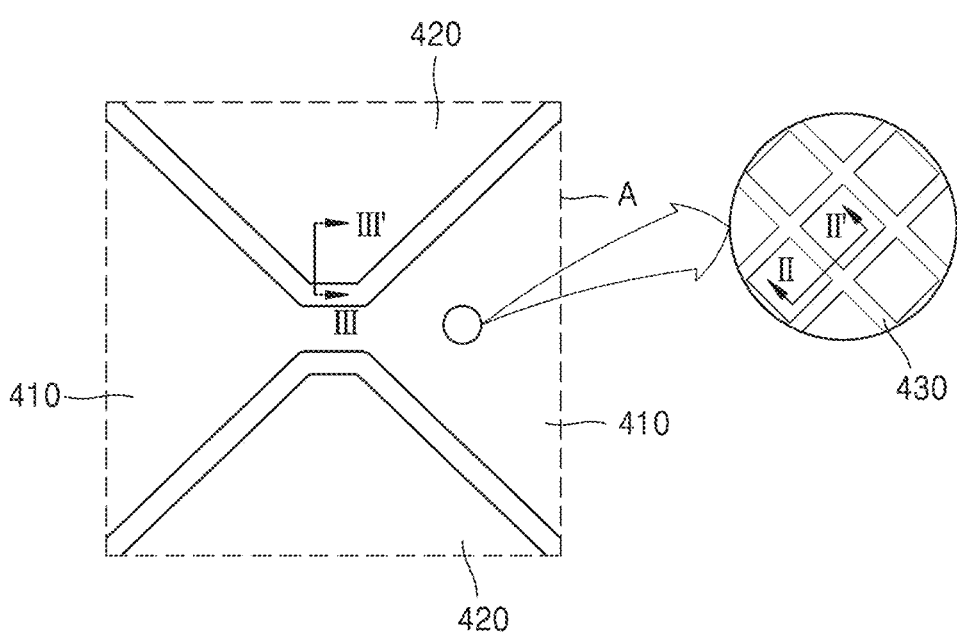
FIG. 5 is a plan view schematically showing an example of a portion A of FIG. 1.
Figure 6A:
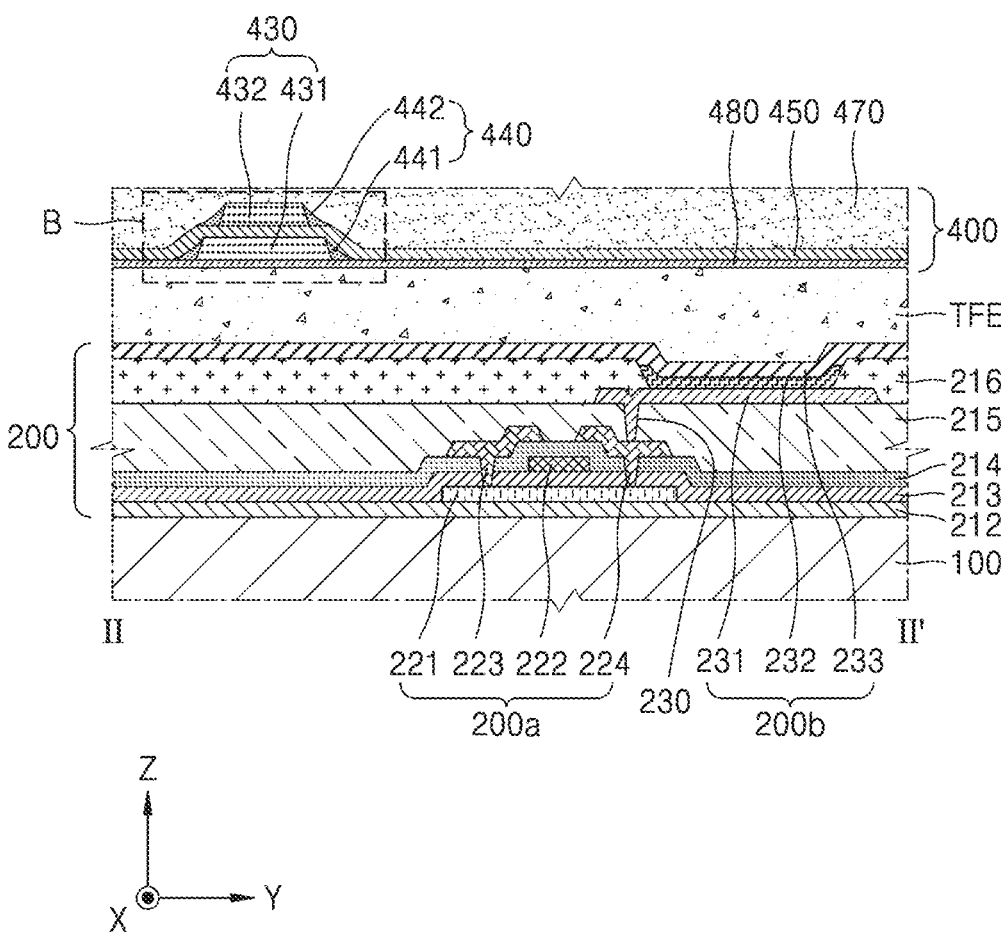
FIG. 6A is a cross-sectional view schematically showing an example of a part of a cross-section II-II' of FIG. 5.
Figure 6B:
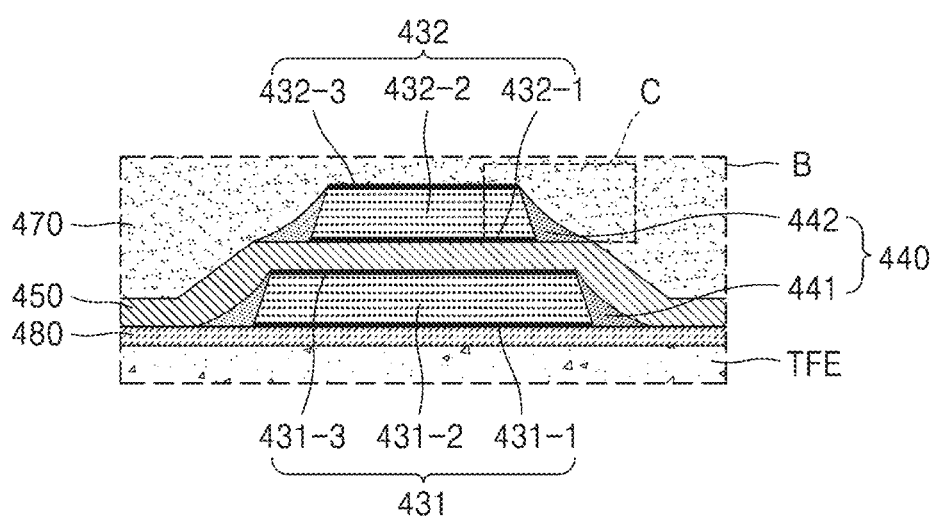
FIG. 6B is a cross-sectional view schematically showing an example of a portion B of FIG. 6A.
Figure 6C:
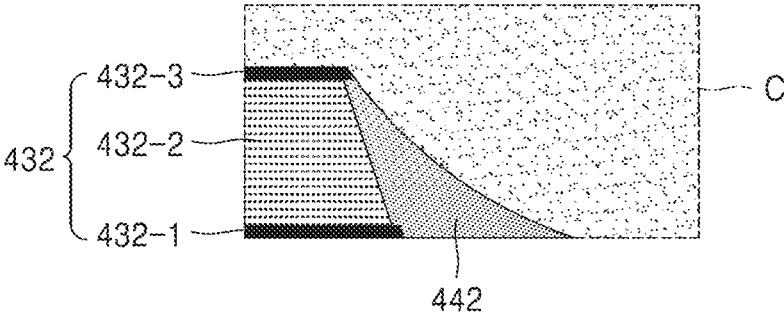
FIG. 6C is a cross-sectional view schematically showing an example of a portion C of FIG. 6B.

FIG. 5 is a plan view schematically showing an example of a portion A of FIG. 1. FIG. 6A is a cross-sectional view schematically showing an example of a part of a cross-section II-II' of FIG. 5. FIG. 6B is a cross-sectional view schematically showing an example of a portion B of FIG. 6A. FIG. 6C is a cross-sectional view schematically showing an example of a portion C of FIG. 6B.

Referring to FIGS. 5 to 6C, the touch screen layer 400 may include a plurality of first sensing patterns 410 arranged in a first direction and a plurality of second sensing patterns 420 arranged in a second direction that is different from the first direction. For example, the second direction may cross the first direction. The plurality of first sensing patterns 410 and the pad portion 300 may be connected by first connection portions, and the plurality of second sensing patterns 420 and the pad portion 300 may be connected by second connection portions.

The plurality of first sensing patterns 410 and the plurality of second sensing patterns 420 may be electrically insulated from each other, and the plurality of second sensing patterns 420 and the plurality of first sensing patterns 410 may be arranged to intersect each other. In some embodiments, the second direction in which the plurality of second sensing patterns 420 are arranged may be perpendicular to the first direction in which the plurality of first sensing patterns 410 are arranged.

The plurality of first sensing patterns 410 and the plurality of second sensing patterns 420 may form one capacitor together with the counter electrode 233. When the user touches the cover layer WIN, the plurality of first sensing patterns 410 and the plurality of second sensing patterns 420 may form another capacitor with an external touch input means such as, for example, a user's finger or a stylus. By connecting these two capacitors in series by a touch, a capacitance change may occur and a position at which the capacitance change occurs and a magnitude of the change may be sensed to implement a touch panel function.

Each of the plurality of first sensing patterns 410 and each of the plurality of second sensing patterns 420 may include a plurality of touch wires 430 forming each pattern. In some embodiments, the touch wires 430 may form a mesh pattern, such that the plurality of first sensing patterns 410 and the plurality of second sensing patterns 420 may be formed as grid patterns. However, the present disclosure is not limited thereto. For example, in some embodiments, the plurality of first sensing patterns 410 and the plurality of second sensing patterns 420 may be formed by repetition of various shapes such as, e.g., triangles, polygons, etc., according to the pattern of the touch wires 430.

For example, according to embodiments, each of the plurality of first sensing patterns 410 and second sensing patterns 420 may include multiple touch wires 430 that define the respective patterns. In some embodiments, the touch wires 430 may be arranged in a mesh configuration, resulting in the first and second sensing patterns 410 and 420 being formed as grid patterns. However, the present disclosure is not limited to this arrangement. For example, in some embodiments, the first and second sensing patterns 410 and 420 may be created using repetitive shapes such as, for example, triangles, polygons, or other geometric configurations, based on the arrangement of the touch wires 430.

The touch wires 430 may include at least any one of, for example, copper, aluminum, molybdenum, and silver, which have excellent conductivity. In some embodiments, the touch wires 430 may be formed by printing or imprinting a material having excellent conductivity as described above on a base film. In an example, the touch wires 430 may be formed by depositing the material having excellent conductivity on the base film, etching and patterning the same. The base film may be formed of an inorganic material by, for example, deposition, etc., on the encapsulation layer TFE.

According to embodiments, the touch wires 430 and the organic light-emitting layer do not overlap each other in a thickness direction (z direction) of the display device 10, so as not to block light coming from the organic light-emitting layer included in the intermediate layer 232.

As the plurality of first sensing patterns 410 and the plurality of second sensing patterns 420 may have excellent light transmittance due to the gird patterns, the plurality of first sensing patterns 410 and the plurality of second sensing patterns 420 may be formed of metal having excellent conductivity instead of a transparent electrode such as, e.g., ITO, etc. Thus, a capacitance change with respect to a touch position is quickly transmitted to a driving circuit side, thereby improving a response speed of the touch screen layer 400.

Referring to FIGS. 6A to 6C, the touch screen layer 400 may include the touch wires 430, each of which may include a first touch wire 431 and a second touch wire 432 disposed on the first touch wire 431.

Each of the touch wires 430 may include a first metal layer, a third metal layer disposed above the first metal layer, and a second metal layer disposed between the first metal layer and the third metal layer. In some embodiments, a material of the first metal layer and a material of the third metal layer may be the same as each other.

In some embodiments, the first touch wire 431 may include a first metal layer 431-1, a third metal layer 431-3 disposed above the first metal layer 431-1, and a second metal layer 431-2 disposed between the first metal layer 431-1 and the third metal layer 431-3. In some embodiments, materials of the first metal layer 431-1 and the third metal layer 431-3 of the first touch wire 431 may be titanium, and a material of the second metal layer 431-2 may be aluminum.

In addition, the second touch wire 432 may include a first metal layer 432-1, a third metal layer 432-3 disposed above the first metal layer 432-1, and a second metal layer 432-2 disposed between the first metal layer 432-1 and the third metal layer 432-3. In some embodiments, materials of the first metal layer 432-1 and the third metal layer 432-3 of the second touch wire 432 may be titanium, and a material of the second metal layer 432-2 may be aluminum.

The third metal layer 431-3 of the first touch wire 431 and the first metal layer 432-1 of the second touch wire 432 may be spaced apart from each other by a first insulating layer 45. However, the third metal layer 431-3 of the first touch wire 431 and the first metal layer 432-1 of the second touch wire 432 may contact each other in at least one region thereof, and in this case, the second metal layer 432-2 of the second touch wire 432 may contact the third metal layer 431-3 of the first touch wire 431.

As an RC delay of a touch wire increases, the thickness of the touch wire may be increased to address the delay, along with the use of low-resistance wires, for example, by increasing the thickness of the Al layer in a Ti/Al/Ti wire. However, increasing the wire thickness proportionally may increase side reflectance, which may lead to visibility issues under outdoor lighting conditions (e.g., the wire may become visible to the user).

When the thicknesses of the first touch wire 431 and the second touch wire 432 increase, seam defects may occur during deposition of a passivation layer 470 on the second touch wire 432 or deposition of the first insulating layer 450 on the first touch wire 431. These defects may occur when the first insulating layer 450 and the passivation layer 470 fail to fully cover the side surfaces of the first touch wire 431 and the second touch wire 432. As a result, exposed areas can lead to short circuits between the first touch wire 431 and the second touch wire 432.

In some embodiments, the first touch wire 431 and the second touch wire 432 may respectively include the first metal layers 431-1 and 432-1, the second metal layers 431-2 and 432-2 disposed on the first metal layers 431-1 and 432-1, and the third metal layers 431-3 and 432-3 disposed on the second metal layers 431-2 and 432-2, and may be, for example, Ti/Al/Ti wires. As the second metal layers 431-2 and 432-2, for example, Al layers, become thicker, end portions of the first metal layers 431-1 and 432-1 or the third metal layers 341-3 and 432-3, for example, Ti tips, may detach due to the manufacturing process or Al characteristics of the touch screen layer 400. These detached fragments of the first metal layers 431-1 and 432-1 or the third metal layers 431-3 and 432-3, for example, Ti particles, may reduce the reliability of the display device 10.

According to embodiments, a light-shielding inclined film 440 capable of alleviating and improving a seam defect problem by reducing a reflectance of a wire side surface without increasing a mask while increasing the thickness of the wire for a low-resistance wire may be disposed on a side surface(s) of each of the touch wires 430. For example, according to embodiments, a light-shielding inclined film 440 may be disposed on the side surface of each touch wire 430, which may reduce the reflectance of the wire's side surface while alleviating seam defects. This approach allows for increased wire thickness to achieve low resistance without adding an additional mask. According to embodiments, among all surfaces of each touch wire 430, the light-shielding inclined film 440 may be disposed only on the side surface(s). For example, according to embodiments, the light-shielding inclined film 440 may be formed on the side surface(s) of each touch wire 430 and not on the upper surface of each touch wire 430.

The light-shielding inclined film 440 may be disposed, for example, on edge(s) (e.g., side surface(s)) of the first touch wire 431 and the second touch wire 432. The light-shielding inclined film 440 may be formed at the edge(s) (e.g., side surface(s)) of the first touch wire 431 and the second touch wire 432 instead of on top surfaces of the first touch wire 431 and the second touch wire 432, which may reduce a barrier reflectance without adding a mask.

The light-shielding inclined film 440 may include a black pigment, and a reflectance may be adjusted according to a content of the black pigment. The black pigment may include at least, for example, a black dye, Amidoschwarz, sodium 1-[1-Hydroxynaphthylazo]-6-nitro-2-naphthol-4-sulfonate, triisocyanato-(2,2';6',6"-terpyridyl-4,4',4"-tricar-boxylato)ruthenium(II)tris(tetra-butylammonium), graphite, carbon nanoparticles, carbon nanotubes, carbon black (acetylene black), or a pigment.

The light-shielding inclined film 440 may include at least an organic material. In addition, the light-shielding inclined film 440 may further include a binder such as, for example, polyimide (PI) or fluorinated polybenzoxazole (PBO).

In some embodiments, a first light-shielding inclined film 441 may be disposed on the edge(s) (e.g., side surface(s)) of the first touch wire 431, and a second light-shielding inclined film 442 may be disposed on the edge(s) (e.g., side surface(s)) of the second touch wire 432. That is, in some embodiments, a first light-shielding inclined film 441 may be disposed along the edge(s) (e.g., side surface(s)) of the first touch wire 431 and not be disposed along the upper surface of the first touch wire 431, and a second light-shielding inclined film 442 may be disposed along the edge(s) (e.g., side surface(s)) of the second touch wire 432 and not be disposed along the upper surface of the second touch wire 432.

For example, the first light-shielding inclined film 441 may be disposed on the edge(s) (e.g., side surface(s)) of the first touch wire 431 and not on the upper surface of the first touch wire 431. The first touch wire 431 may be formed on a buffer layer 480, and the first light-shielding inclined film 441 may extend from the edge(s) (e.g., side surface(s)) of the first touch wire 431 to a region on the buffer layer 480, thus forming an inclined surface.

The first insulating layer 450 may be formed on the first touch wire 431 and the buffer layer 480, and as the first light-shielding inclined film 441 includes an inclined film extending from the edge(s) (e.g., side surface(s)) of the first touch wire 431 to the region on the buffer layer 480, seam defects may be prevented and/or alleviated during deposition of the first insulating layer 450.

As the first light-shielding inclined film 441 is formed on a side surface of the first touch wire 431, tips of the first metal layer 431-1 and the third metal layer 431-3 of the first touch wire 431 may be protected.

The second light-shielding inclined film 442 may be disposed on the edge(s) (e.g., side surface(s)) of the second touch wire 432 instead of on the upper surface of the second touch wire 432. The second touch wire 432 may be formed on the first insulating layer 450, and the second light-shielding inclined film 442 may extend from the edge(s) (e.g., side surface(s)) of the second touch wire 432 to a region on the first insulating layer 450, thus forming an inclined surface.

The passivation layer 470 may be formed on the second touch wire 432 and the first insulating layer 450, and as the second light-shielding inclined film 442 includes an inclined film extending from the edge(s) (e.g., side surface(s)) of the second touch wire 432 to the region on the first insulating layer 450, seam defects may be prevented and/or alleviated during deposition of the passivation layer 470.

As the second light-shielding inclined film 442 is formed on a side surface(s) of the second touch wire 432, tips of the first metal layer 432-1 and the third metal layer 432-3 of the second touch wire 432 may be protected.

Referring to FIG. 6C, the first metal layer 432-1 and the third metal layer 432-3 of the second touch wire 432 may protrude further compared to the second metal layer 432-2, thus forming tips. These tips may result due to the manufacturing process and may be more pronounced, for example, when the second touch wire 432 has a Ti/Al/Ti structure.

The tip of the first metal layer 432-1 or the third metal layer 432-3 of the second touch wire 432 may detach and form a fragment during the formation of the second touch wire 432 and the lamination of the passivation layer 470. This fragment may cause short circuits and issues such as reduced reliability of the display device 10.

The second light-shielding inclined film 442 may be formed on a side surface of the second touch wire 432. In some embodiments, the second light-shielding inclined film 442 may form an inclined surface by covering the tips of the first metal layer 432-1 and the third metal layer 432-3 of the second touch wire 432.

The second light-shielding inclined film 442 may prevent the tips from detaching and forming fragments by covering the tips. By being positioned on the side surface of the second touch wire 432, the second light-shielding inclined film 442 may reduce the risk of short circuits and improve the reliability of the display device 10.

The structure and effects described above may be equally applied to the first light-shielding inclined film 441 and may be applied to all wires described below.

The first insulating layer 450 may be disposed between the first touch wire 431 and the second touch wire 432. The first insulating layer 450 may insulate the first touch wire 431 from the second touch wire 432 and prevent them from being exposed. The first insulating layer 450 may include an organic material or an inorganic material. In some embodiments, the first insulating layer 450 may include an inorganic material such as, for example, silicon oxide, silicon nitride and/or silicon oxynitride, and may have a single-layer or multi-layer structure including such a material.

When the first insulating layer 450 is laminated on top surfaces of the first touch wire 431 and the buffer layer 480, seam defects may be prevented, and thus, a continuously extending layer may be formed due to the first light-shielding inclined film 441 forming an inclined surface by extending to a region on the top surface of the buffer layer 480 from the side surface of the first touch wire 431.

The touch screen layer 400 may further include the passivation layer 470 disposed to cover, for example, the touch wires 430. In some embodiments, the passivation layer 470 may cover the second touch wire 432 on the first touch wire 431 and the first insulating layer 450 between the first touch wire 431 and the second touch wire 432. The passivation layer 470 may protect the touch wires 430.

The passivation layer 470 may be formed of an inorganic insulating material. In some embodiments, the passivation layer 470 may include, for example, silicon nitride (SiNx), silicon oxide (SiOx), silicon oxynitride (SiON), silicon oxynitride, hafnium oxide, aluminum oxide, titanium oxide, tantalum oxide, zinc oxide, etc., which may be used alone or in combination. The passivation layer 470 may include a single layer or multiple layers.

In an embodiment, the touch screen layer 400 may further include the buffer layer 480 disposed between the first touch wire 431 and the encapsulation layer TFE. The buffer layer 480 may prevent impurities from spreading into the pixel layer 200. The buffer layer 480 may include, for example, an inorganic insulating material such as a silicon compound, a metal oxide, etc., and have a single-layer structure or a multi-layer structure including a plurality of insulating layers.

The touch screen layer 400 according to embodiments of the present disclosure may be formed as below.

First, after the first touch wire 431 is formed on the encapsulation layer TFE, an organic solution that is a material of the first light-shielding inclined film 441 may be applied onto the first touch wire 431 and the encapsulation layer TFE. The organic solution may contain a solid and a solvent. According to embodiments, a content of the solid may be at least about 0.5 wt % but not more than about 5 wt % of the organic solution of the entire organic film.

The organic film may be formed by evaporating the solvent from the organic solution, and when the solvent is removed, the solid may move toward the side surface of the first touch wire 431 in a direction in which the surface energy decreases. That is, the solid in the edge(s) (e.g., side surface(s)) of the first touch wire 431 may form the first light-shielding inclined film 441 which is an organic film. In addition, the degree of curing of the first light-shielding inclined film 441 may be secured through low-temperature curing.

Due to the Marangoni effect, solvent evaporation may be fast and a temperature may be locally low in a side step area formed by the first touch wire 431, such that the organic solution may move to the step area and thus the first light-shielding inclined film 441 may be formed inclinedly on the side surface of the first touch wire 431 and may not be formed in the other part of the first touch wire 431 than the step area of the side surface. That is, due to the Marangoni effect, solvent evaporation may occur rapidly, causing a localized temperature drop in the step area formed by the first touch wire 431. As a result, the organic solution may migrate to the step area, leading to the formation of the first light-shielding inclined film 441 on the side surface of the first touch wire 431. This film may be inclined on the side surface and may not form on other parts of the first touch wire 431 outside the step area.

The first light-shielding inclined film 441 may be formed, for example, by evaporation of the solvent, and may be formed to have a negative curvature due to the characteristics of the organic solution that is a material of the first light-shielding inclined film 441.

After the first light-shielding inclined film 441 is formed, the first insulating layer 450 may be formed on the first touch wire 431, and the second touch wire 432 may be disposed on the first insulating layer 450 and the first touch wire 431 in such a way to contact the first touch wire 431 on a region thereof.

In the same manner as a method of forming the first light-shielding inclined film 441 on the side surface of the second touch wire 432, the second light-shielding inclined film 442 may be formed. That is, after the organic solution that is a material of the second light-shielding inclined film 442 is coated, the solvent may be dried and cured to form the second light-shielding inclined film 442. The second light-shielding inclined film 442 may also be formed to have a negative curvature like the first light-shielding inclined film 441.

After the second light-shielding inclined film 442 is formed, the passivation layer 470 may be laminated on the second touch wire 432 to form the touch screen layer 400.

Figure 7A:
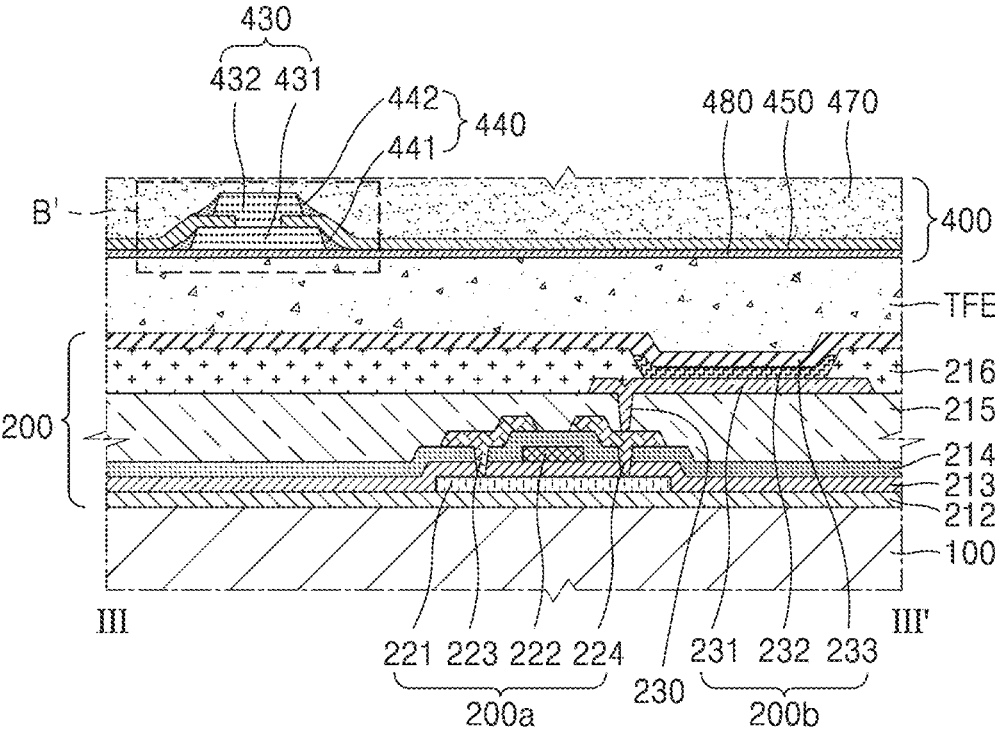
FIG. 7A is a cross-sectional view schematically showing an example of a part of a cross-section III-III' of FIG. 5.
Figure 7B:
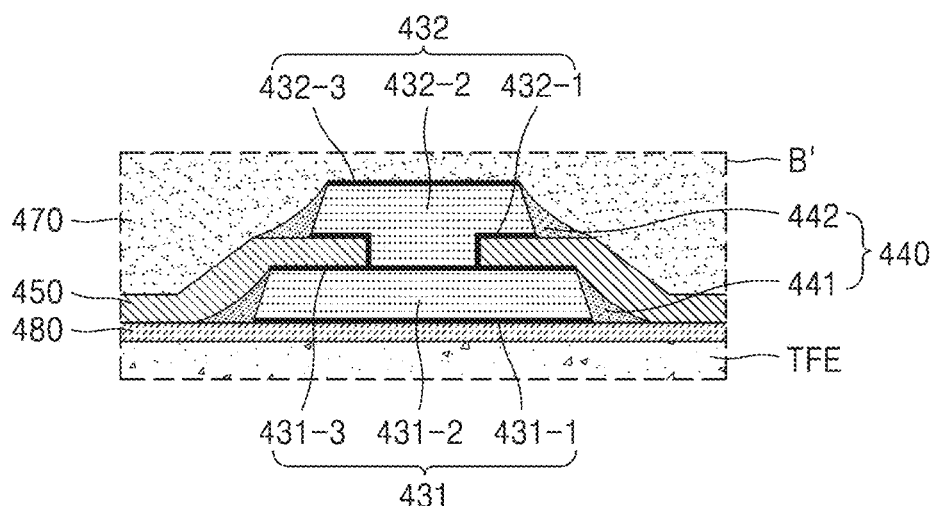
FIG. 7B is a cross-sectional view schematically showing an example of a portion B' of FIG. 7A.

FIG. 7A is a cross-sectional view schematically showing an example of a part of a cross-section III-III' of FIG. 5. FIG. 7B is a cross-sectional view schematically showing an example of a portion B' of FIG. 7A.

Referring to FIGS. 7A and 7B, regions of the first touch wire 431 and the second touch wire 432 may directly contact each other, and thus, may be electrically connected to each other.

In some embodiments, the third metal layer 431-3 of the first touch wire 431 and the first metal layer 432-1 of the second touch wire 432 may contact each other in at least one region thereof, and in this case, the second metal layer 432-2 of the second touch wire 432 may contact the third metal layer 431-3 of the first touch wire 431.

In the regions where the first touch wire 431 and the second touch wire 432 directly contact each other, the first light-shielding inclined film 441 may be formed on the side surface of the first touch wire 431 and the second light-shielding inclined film 442 may be formed on the side surface of the second touch wire 432.

Figure 8A:
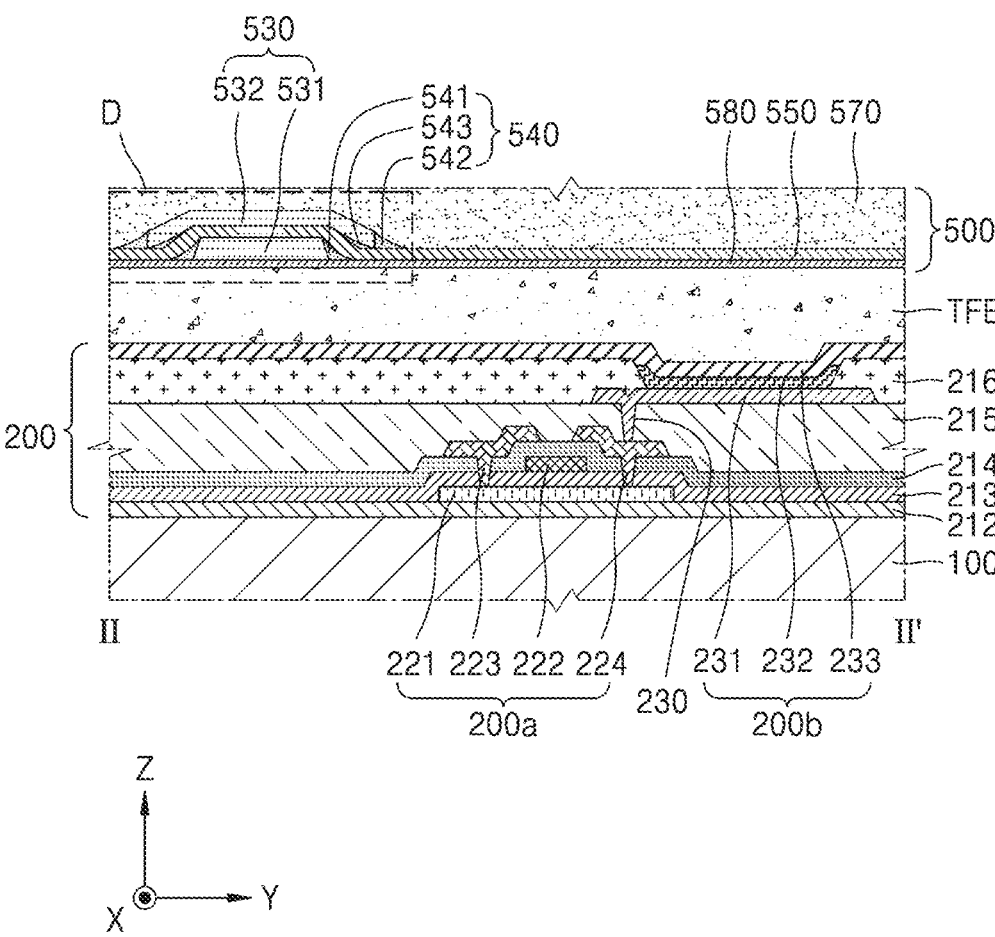
FIG. 8A is a cross-sectional view schematically showing an example of a part of a cross-section II-II' of FIG. 5.
Figure 8B:
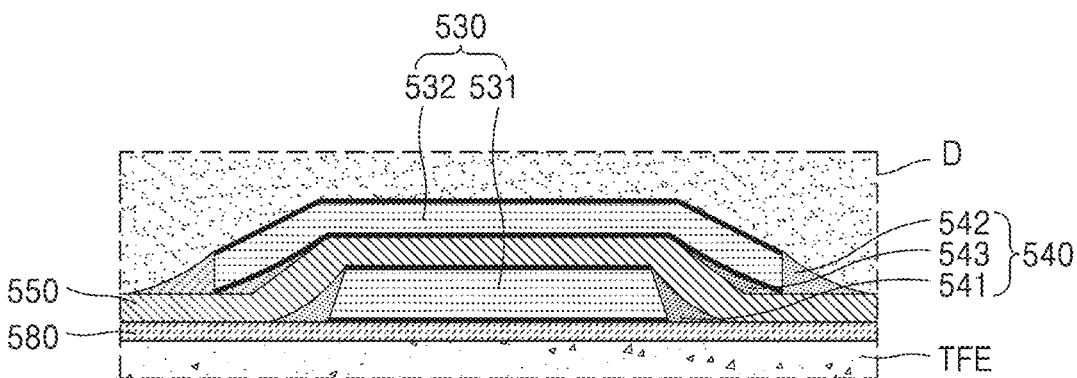
FIG. 8B is a cross-sectional view schematically showing an example of a portion D of FIG. 8A.

FIG. 8A is a cross-sectional view schematically showing an example of a part of a cross-section II-II' of FIG. 5. FIG. 8B is a cross-sectional view schematically showing an example of a portion D of FIG. 8A.

Referring to FIGS. 8A and 8B, a touch screen layer 500 may include a plurality of touch wires 530, each of which may include a first touch wire 531 and a second touch wire 532 disposed on the first touch wire 531.

Regions of the first touch wire 531 and the second touch wire 532 may directly contact each other, and thus, may be electrically connected to each other.

Each of the touch wires 530 may include a first metal layer, a third metal layer disposed above the first metal layer, and a second metal layer disposed between the first metal layer and the third metal layer. In some embodiments, a material of the first metal layer and a material of the third metal layer may be the same as each other. Each of the touch wires 530 may be, for example, a Ti/Al/Ti wire.

A light-shielding inclined film 540 may be formed to alleviate and improve a seam defect problem by reducing a reflectance of a wire side without increasing a mask while increasing the thickness of the wire for a low-resistance wire.

In some embodiments, a first light-shielding inclined film 541 may be formed at an edge(s) (e.g., side surface(s)) of the first touch wire 531, a second light-shielding inclined film 542 may be formed at an edge(s) (e.g., side surface(s)) of the second touch wire 532, and a third light-shielding inclined film 543 may be formed in a region of a first insulating layer 550 where a step is formed.

The first light-shielding inclined film 541 may be disposed on the edge(s) (e.g., side surface(s)) of the first touch wire 531 instead of on the upper surface of the first touch wire 531. For example, the first light-shielding inclined film 541 may be disposed along the edge(s) (e.g., side surface(s)) of the first touch wire 531 and not be disposed on the upper surface of the first touch wire 531. The first touch wire 531 may be formed on a buffer layer 580, and the first light-shielding inclined film 541 may extend from the edge(s) (e.g., side surface(s)) of the first touch wire 531 to a region on the buffer layer 580, thus forming an inclined surface.

The first insulating layer 550 may be formed on the first touch wire 531 and the buffer layer 580, and as the first light-shielding inclined film 541 includes an inclined film extending from the edge(s) (e.g., side surface(s)) of the first touch wire 531 to the region on the buffer layer 580, which may prevent seam defects from occurring during deposition of the first insulating layer 550.

As the first light-shielding inclined film 541 is formed on a side surface of the first touch wire 531, tips of a first metal layer and a third metal layer of the first touch wire 531 may be protected.

The second light-shielding inclined film 542 may be disposed on the edge(s) (e.g., side surface(s)) of the second touch wire 532 and not disposed on the upper surface of the second touch wire 532. The second touch wire 532 may be formed on the first insulating layer 550, and the second light-shielding inclined film 542 may extend from the edge(s) (e.g., side surface(s)) of the second touch wire 532 to a region on the first insulating layer 550, thus forming an inclined surface.

A passivation layer 570 may be formed on the second touch wire 532 and the first insulating layer 550, and as the second light-shielding inclined film 542 includes an inclined film extending from the edge(s) (e.g., side surface(s)) of the second touch wire 532 to the region on the first insulating layer 550, seam defects may be prevented from occurring during deposition of the passivation layer 570.

As the second light-shielding inclined film 542 is formed on a side surface of the second touch wire 532, tips of a first metal layer and a third metal layer of the second touch wire 532 may be protected.

When the first insulating layer 550 is formed on the first touch wire 531, a step may be formed in a part of the first insulating layer 550, which covers the side surface of the first touch wire 531, due to the step of the first touch wire 531.

When the second touch wire 532 is formed on the first insulating layer 550 and the first touch wire 531 while covering the step formed on the side surface of the first insulating layer 550, the second touch wire 532 may also have a disposition defect problem due to the step formed on the side surface of the first insulating layer 550. For example, the light-shielding inclined film 540 may have a negative curvature such that even when the first light-shielding inclined film 541 is formed, a problem may still occur due to the step of the first touch wire 531 and the resulting step of the first insulating layer 550.

The third light-shielding inclined film 543 may be formed to have an inclined surface on a step region of the first insulating layer 550, such that the second touch wire 532 may be structurally stably disposed and may alleviate and prevent a short-circuit with the first touch wire 531.

Moreover, the third light-shielding inclined film 543 may prevent a tip of the first metal layer of the second touch wire 532 from being detached by forming the inclined surface, which may improve the reliability of the display device 10.

The third light-shielding inclined film 543 may be formed by coating an organic solution, which is a material of the third light-shielding inclined film 543, drying, and then curing a solvent, before forming the second touch wire 532 after forming the first insulating layer 550.

The descriptions of the touch wires 430, the light-shielding inclined film 440, the first insulating layer 450, the passivation layer 470, and the buffer layer 480, made with reference to FIGS. 5 to 6C, may also apply to the touch wires 530, the light-shielding inclined film 540, the first insulating layer 550, the passivation layer 570, and the buffer layer 580, except for the parts specifically described above FIG. 9A is a cross-sectional view schematically showing an example of the part of the cross-section II-II' of FIG. 5. FIG. 9B is a cross-sectional view schematically showing an example of a portion E of FIG. 9A.

Figure 9A:
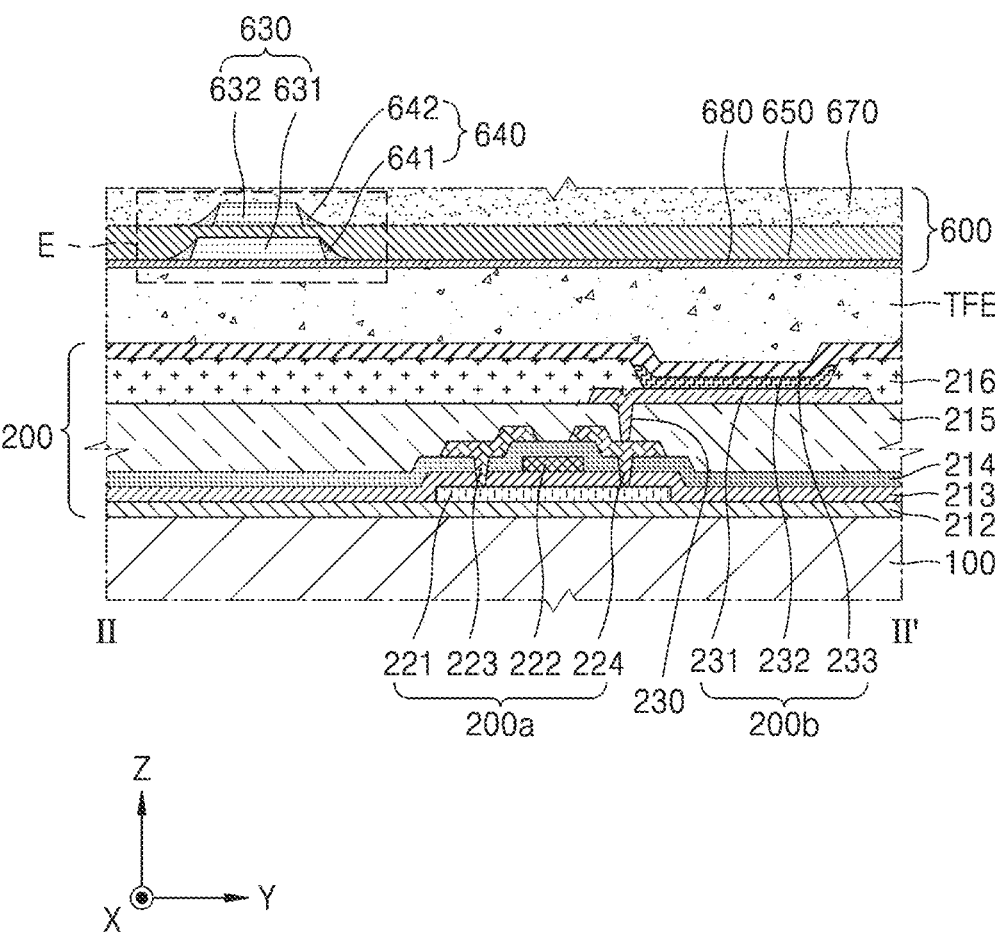
FIG. 9A is a cross-sectional view schematically showing an example of a part of a cross-section II-II' of FIG. 5.
Figure 9B:
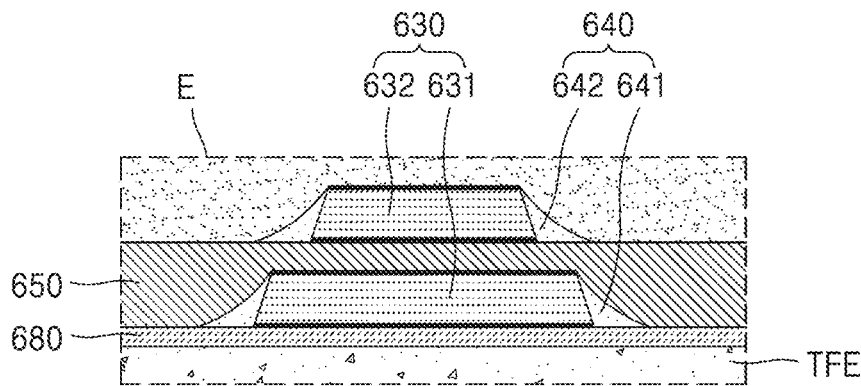
FIG. 9B is a cross-sectional view schematically showing an example of a portion E of FIG. 9A.

Referring to FIGS. 9A and 9B, a touch screen layer 600 may include a plurality of touch wires 630, each of which may include a first touch wire 631 and a second touch wire 632 disposed on the first touch wire 631.

Regions of the first touch wire 631 and the second touch wire 632 may directly contact each other, and thus, the first touch wire 631 and the second touch wire 632 may be electrically connected to each other.

Each of the touch wires 630 may include a first metal layer, a third metal layer disposed above the first metal layer, and a second metal layer disposed between the first metal layer and the third metal layer. In some embodiments, a material of the first metal layer and a material of the third metal layer may be the same as each other. Each of the touch wires 630 may be, for example, a Ti/Al/Ti wire.

A light-shielding inclined film 640 may be formed to prevent seam defects by reducing a reflectance of a wire side without increasing a mask while increasing the thickness of the wire for a low-resistance wire. That is, a light-shielding inclined film 640 may be formed to prevent seam defects and address seam defect issues by reducing the reflectance of the wire's side surface, without requiring an additional mask, while allowing for increased wire thickness to achieve low resistance.

In some embodiments, a first light-shielding inclined film 641 may be disposed on the edge(s) (e.g., side surface(s)) of the first touch wire 631, and a second light-shielding inclined film 642 may be disposed on the edge(s) (e.g., side surface(s)) of the second touch wire 632.

The first light-shielding inclined film 641 may be disposed on the edge(s) (e.g., side surface(s)) of the first touch wire 631 and not formed on the upper surface of the first touch wire 631. The first touch wire 631 may be formed on a buffer layer 680, and the first light-shielding inclined film 641 may extend from the edge(s) (e.g., side surface(s)) of the first touch wire 631 to a region on the buffer layer 680, thus forming an inclined surface.

A first insulating layer 650 may be formed on the first touch wire 631 and the buffer layer 680, and as the first light-shielding inclined film 641 includes an inclined film extending from the edge(s) (e.g., side surface(s)) of the first touch wire 631 to the region on the buffer layer 680, seam defects may be prevented from occurring during deposition of the first insulating layer 650.

As the first light-shielding inclined film 641 is formed on a side surface of the first touch wire 631, tips of a first metal layer and a third metal layer of the first touch wire 631 may be protected.

A second light-shielding inclined film 642 may be disposed in the edge(s) (e.g., side surface(s)) of the second touch wire 632 instead of on the upper surface of the second touch wire 632. The second touch wire 632 may be formed on the first insulating layer 650, and the second light-shielding inclined film 642 may extend from the edge(s) (e.g., side surface(s)) of the second touch wire 632 to a region on the first insulating layer 650, thus forming an inclined surface.

A passivation layer 670 may be formed on the second touch wire 632 and the first insulating layer 650, and as the second light-shielding inclined film 642 includes an inclined film extending from the edge(s) (e.g., side surface(s)) of the second touch wire 632 to the region on the first insulating layer 650, seam defects may be prevented from occurring during deposition of the passivation layer 670.

As the second light-shielding inclined film 642 is formed on a side surface of the second touch wire 632, tips of a first metal layer and a third metal layer of the second touch wire 632 may be protected.

The first insulating layer 650 may be disposed between the first touch wire 631 and the second touch wire 632. The first insulating layer 650 may insulate the first touch wire 631 from the second touch wire 632 and prevent them from being exposed.

The first insulating layer 650 may include an organic material or an inorganic material. In some embodiments, the first insulating layer 650 may include an organic insulating material to planarize a top surface. The first insulating layer 650 may be formed of an organic insulating material such as, for example, acrylic resin, epoxy resin, phenolic resin, polyamides resin, polyimides rein, and unsaturated polyester and may include organic insulating materials such as, for example, unsaturated polyesters resin, polyphenylenethers resin, polyphenylenesulfides resin, benzocyclobutene (BCB), etc. The first insulating layer 650 may have a single-layer or multi-layer structure including the above-described material.

The descriptions of the touch wires 430, the light-shielding inclined film 440, the first insulating layer 450, the passivation layer 470, and the buffer layer 480, with reference to FIGS. 5 to 6C, may also apply to the touch wires 630, the light-shielding inclined film 640, the first insulating layer 650, the passivation layer 670, and the buffer layer 680, except for the parts specifically described above FIG. 10A is a cross-sectional view schematically showing an example of the part of the cross-section II-II' of FIG. 5. FIG. 10B is a cross-sectional view schematically showing an example of a portion F of FIG. 10A.

Figure 10A:
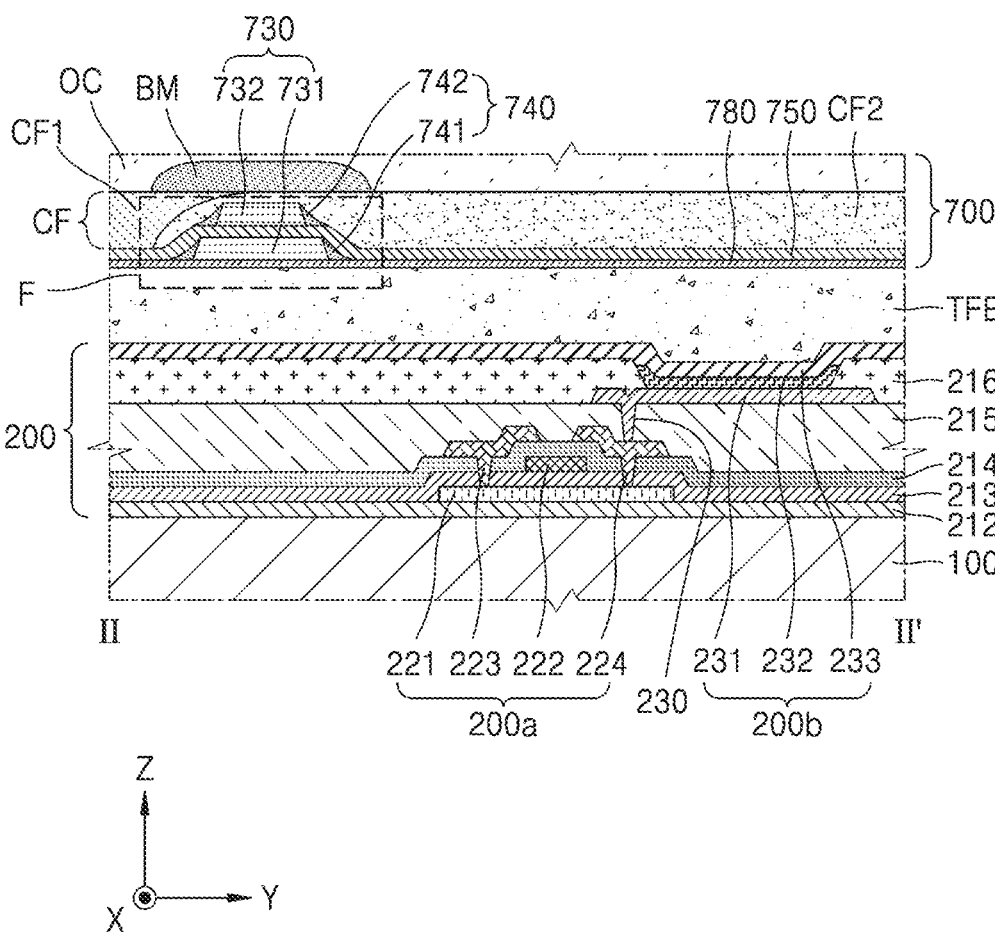
FIG. 10A is a cross-sectional view schematically showing an example of a part of a cross-section II-II' of FIG. 5.
Figure 10B:
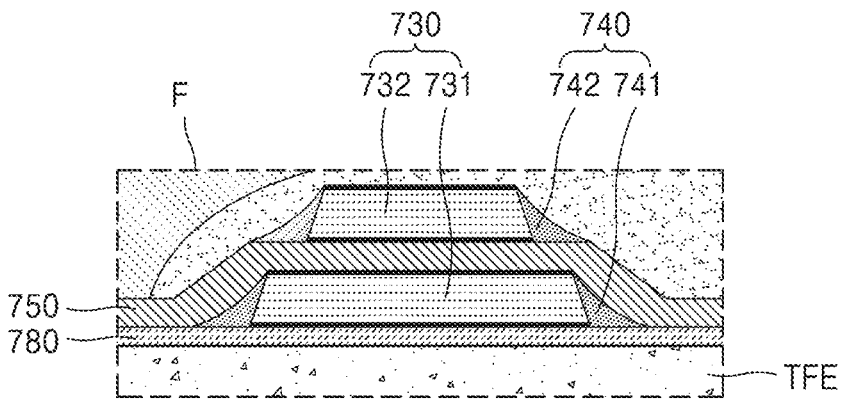
FIG. 10B is a cross-sectional view schematically showing an example of a portion F of FIG. 10A.

Referring to FIGS. 10A and 10B, a touch screen layer 700 may include a plurality of touch wires 730, each of which may include a first touch wire 731 and a second touch wire 732 disposed on the first touch wire 731.

Regions of the first touch wire 731 and the second touch wire 732 may directly contact each other, and thus, the first touch wire 731 and the second touch wire 732 may be electrically connected to each other.

Each of the touch wires 730 may include a first metal layer, a third metal layer disposed above the first metal layer, and a second metal layer disposed between the first metal layer and the third metal layer. In some embodiments, a material of the first metal layer and a material of the third metal layer may be the same as each other. Each of the touch wires 730 may be, for example, a Ti/Al/Ti wire.

A light-shielding inclined film 740 may be formed to prevent seam defects by reducing a reflectance of a wire side without increasing a mask while increasing the thickness of the wire for a low-resistance wire.

In some embodiments, a first light-shielding inclined film 741 may be disposed on the edge(s) (e.g., side surface(s)) of the first touch wire 731, and a second light-shielding inclined film 742 may be disposed on the edge(s) (e.g., side surface(s)) of the second touch wire 732.

The first light-shielding inclined film 741 may be disposed on the edge(s) (e.g., side surface(s)) of the first touch wire 731 instead of on the upper surface of the first touch wire 731. The first touch wire 731 may be formed on a buffer layer 780, and the first light-shielding inclined film 741 may extend from the edge(s) (e.g., side surface(s)) of the first touch wire 731 to a region on the buffer layer 780, thus forming an inclined surface.

A first insulating layer 750 may be formed on the first touch wire 731 and the buffer layer 780, and as the first light-shielding inclined film 741 includes an inclined film extending from the edge(s) (e.g., side surface(s)) of the first touch wire 731 to the region on the buffer layer 780, seam defects may be prevented from occurring during deposition of the first insulating layer 750.

As the first light-shielding inclined film 741 is formed on a side surface of the first touch wire 731, tips of a first metal layer and a third metal layer of the first touch wire 731 may be protected.

A second light-shielding inclined film 742 may be disposed on the edge(s) (e.g., side surface(s)) of the second touch wire 732 instead of on the upper surface of the second touch wire 732. The second touch wire 732 may be formed on the first insulating layer 750, and the second light-shielding inclined film 742 may extend from the edge(s) (e.g., side surface(s)) of the second touch wire 732 to a region on the first insulating layer 750, thus forming an inclined surface.

A color filter CF may be formed on the second touch wire 732 and the first insulating layer 750, and as the second light-shielding inclined film 742 includes an inclined film extending from the edge(s) (e.g., side surface(s)) of the second touch wire 732 to the region on the first insulating layer 750, seam defects may be prevented from occurring during deposition of the color filter CF.

As the second light-shielding inclined film 742 is formed on a side surface of the second touch wire 732, tips of a first metal layer and a third metal layer of the second touch wire 732 may be protected.

The display device 10 may further include the color filter CF disposed in the touch screen layer 700. The color filter CF disposed on the second touch wire 732 and the first insulating layer 750 may cover the touch wires 730.

The color filter CF may suppress reflection of light introduced from outside of the display device 10, and minimize or reduce a loss of light discharged to the outside of the display device 10. As the color filter CF transmits only light having a wavelength band of a color being discharged, a color to be expressed may be implemented more clearly.

The color filter CF may include a red color filter CF1, a green color filter CF2, and a blue color filter CF3. The red color filter CF1 may transmit light having a wavelength in the red wavelength range, the green color filter CF2 may transmit light having a wavelength in the green wavelength range, and the blue color filter CF3 may transmit light having a wavelength in the blue wavelength range. The color filter CF may be formed sequentially in order of the green color filter CF2, the red color filter CF1, and the blue color filter CF3.

The color filter CF may include a color filter overlapping portion where the red color filter CF1, the green color filter CF2, and the blue color filter CF3 overlap one another. The color filter overlapping portion may be disposed on the touch wires 730.

The red, green, and blue color filters CF1, CF2, and CF3 respectively transmit red light, green light, and blue light, such that a visible light ray including red light, green light, and blue light is not transmitted in an area where the red, green, and blue color filters CF1, CF2, and CF3 overlap one another. While it is described that the color filter CF is formed sequentially in order of the green color filter CF2, the red color filter CF1, and the blue color filter CF3, a lamination order of the color filter CF is not limited thereto.

Although the color filter CF is described as including the red, green, and blue color filters CF1, CF2, and CF3, the color filter CF may include any color of three primary colors, without being limited thereto. For example, in some embodiments, the color filter CF may include magenta, yellow, and cyan color filters that respectively transmit magenta light, yellow light, and cyan light.

A light-shielding member BM may be disposed on the color filter CF such that at least a region thereof overlaps the touch wires 730 in a thickness direction (z direction) of the display device 10.

An overcoating layer OC may be disposed on the color filter CF. The overcoating layer OC may be formed on the color filter CF to protect the color filter CF by covering the light-shielding member BM, and planarize the surface of a layer on which the color filter CF is formed.

The overcoating layer OC may include an organic insulating film. The organic insulating film may include, for example, general purpose polymers (e.g., PMMA, PS), polymer derivatives with phenol groups, acrylic polymers, imide polymers, aryl ether polymers, amide polymers, fluorine polymers, p-xylene polymers, vinyl alcohol polymers, blends thereof, etc. The overcoating layer OC may be formed of complex laminates of inorganic insulating films and organic insulating films. The inorganic insulating film may include, for example, $SiO_2$, SiNx, SiON, $Al_2O_3$, $TiO_2$, $Ta_2O_5$, $HfO_2$, $ZrO_2$, BST, PZT, etc.

The descriptions of the touch wires 430, the light-shielding inclined film 440, the first insulating layer 450, and the buffer layer 480, as referenced in FIGS. 5 to 6C, may also apply to the touch wires 730, the light-shielding inclined film 740, the first insulating layer 750, and the buffer layer 780, except for the parts specifically described above.

Figure 11A:
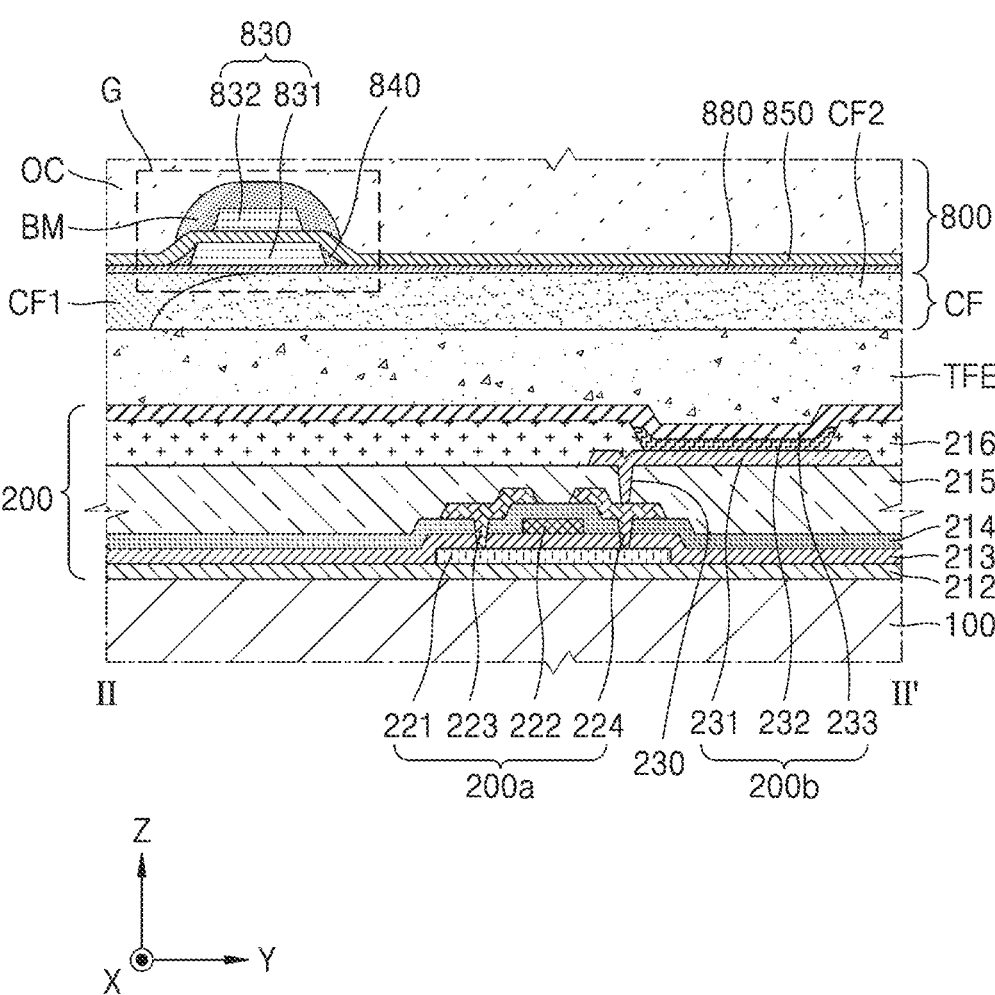
FIG. 11A is a cross-sectional view schematically showing an example of a part of a cross-section II-II' of FIG. 5.
Figure 11B:
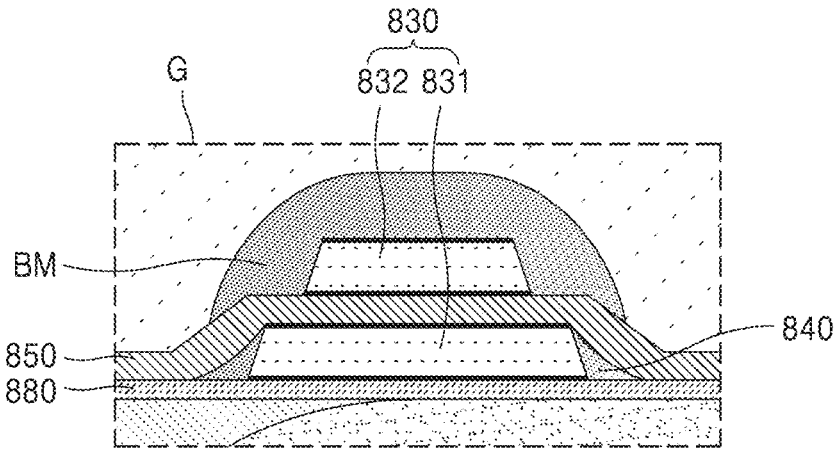
FIG. 11B is a cross-sectional view schematically showing an example of a portion G of FIG. 11A.

FIG. 11A is a cross-sectional view schematically showing an example of the part of the cross-section II-II' of FIG. 5. FIG. 11B is a cross-sectional view schematically showing an example of a portion G of FIG. 11A.

Referring to FIGS. 11A and 11B, a touch screen layer 800 may include a plurality of touch wires 830, each of which may include a first touch wire 831 and a second touch wire 832 disposed on the first touch wire 831.

Regions of the first touch wire 831 and the second touch wire 832 may directly contact each other, and thus, the first touch wire 831 and the second touch wire 832 may be electrically connected to each other.

Each of the touch wires 830 may include a first metal layer, a third metal layer disposed above the first metal layer, and a second metal layer disposed between the first metal layer and the third metal layer. In some embodiments, a material of the first metal layer and a material of the third metal layer may be the same as each other. Each of the touch wires 830 may be, for example, a Ti/Al/Ti wire.

A light-shielding inclined film 840 may be formed to alleviate and improve a seam defect problem by reducing a reflectance of a wire side without increasing a mask while increasing the thickness of the wire for a low-resistance wire.

In some embodiments, the light-shielding inclined film 840 may be disposed in the edge(s) (e.g., side surface(s)) of the first touch wire 831, and the light-shielding member BM may be disposed on the second touch wire 832. That is, the light-shielding member BM may be further disposed on the touch wires 830 such that at least a region thereof overlaps the touch wires 830 in the thickness direction (z direction) of the display device 10.

The light-shielding inclined film 840 may be disposed on the edge(s) (e.g., side surface(s)) of the first touch wire 831 instead of on the upper surface of the first touch wire 831. The first touch wire 831 may be formed on a buffer layer 880, and the light-shielding inclined film 840 may extend from the edge(s) (e.g., side surface(s)) of the first touch wire 831 to a region on the buffer layer 880, thus forming an inclined surface.

A first insulating layer 850 may be formed on the first touch wire 831 and the buffer layer 880, and as the light-shielding inclined film 840 includes an inclined film extending from the edge(s) (e.g., side surface(s)) of the first touch wire 831 to the region on the buffer layer 880, seam defects may be prevented from occurring during deposition of the first insulating layer 850.

As the light-shielding inclined film 840 is formed on a side surface of the first touch wire 831, tips of a first metal layer and a third metal layer of the first touch wire 831 may be protected.

The light-shielding member BM may be disposed on the touch wires 830. The overcoating layer OC may be formed on the second touch wire 832 and the first insulating layer 850, and the light-shielding member BM may cover a top portion and a side surface of the second touch wire 832, in which may prevent seam defects from occurring during deposition of the overcoating layer OC.

That is, the light-shielding inclined film 840 may cover the side surface of the first touch wire 831, and the light-shielding member BM may cover the second touch wire 832.

As the light-shielding member BM is formed on the second touch wire 832, tips of a first metal layer and a third metal layer of the second touch wire 832 may be protected.

The color filter CF may be disposed between the touch screen layer 800 and the display panel DP, for example, between the touch screen layer 800 and the encapsulation layer TFE. The light-shielding member BM may be disposed on the touch wires 830.

The color filter CF may suppress reflection of light introduced from outside of the display device 10, and minimize or reduce a loss of light discharged to the outside of the display device 10. As the color filter CF transmits only light having a wavelength band of a color being discharged, a color to be expressed may be implemented more clearly.

The color filter CF may include the red color filter CF1, the green color filter CF2, and the blue color filter CF3. The red color filter CF1 may transmit light having a wavelength in the red wavelength range, the green color filter CF2 may transmit light having a wavelength in the green wavelength range, and the blue color filter CF3 may transmit light having a wavelength in the blue wavelength range. The color filter CF may be formed sequentially in order of the green color filter CF2, the red color filter CF1, and the blue color filter CF3.

The color filter CF may include a color filter overlapping portion where the red color filter CF1, the green color filter CF2, and the blue color filter CF3 overlap one another. The touch wires 830 may be disposed on the color filter overlapping portion.

The red, green, and blue color filters CF1, CF2, and CF3 respectively transmit red light, green light, and blue light, such that a visible light ray including red light, green light, and blue light is not transmitted in an area where the red, green, and blue color filters CF1, CF2, and CF3 overlap one another. While it is described that the color filter CF is formed sequentially in order of the green color filter CF2, the red color filter CF1, and the blue color filter CF3, a lamination order of the color filter CF is not limited thereto.

Although the color filter CF is described as including the red, green, and blue color filters CF1, CF2, and CF3, the color filter CF may include any color of three primary colors, without being limited thereto. In some embodiments, the color filter CF may include magenta, yellow, and cyan color filters that respectively transmit magenta light, yellow light, and cyan light.

The overcoating layer OC may be disposed on the light-shielding member BM on the touch wires 830. The overcoating layer OC may be formed on the touch wires 830 and the first insulating layer 850 to protect the touch wires 830 and the first insulating layer 850 by covering the light-shielding member BM, and planarize the surface of a layer on which the first insulating layer 850 is formed.

The overcoating layer OC may include an organic insulating film. The organic insulating film may include, for example, general purpose polymers (e.g., PMMA, PS), polymer derivatives with phenol groups, acrylic polymers, imide polymers, aryl ether polymers, amide polymers, fluorine polymers, p-xylene polymers, vinyl alcohol polymers, blends thereof, etc. The overcoating layer OC may be formed of complex laminates of inorganic insulating films and organic insulating films. The inorganic insulating film may include, for example, $SiO_2$, SiNx, SiON, $Al_2O_3$, $TiO_2$, $Ta_2O_5$, $HfO_2$, $ZrO_2$, BST, PZT, etc.

The descriptions of the touch wires 430, the light-shielding inclined film 440, the first insulating layer 450, and the buffer layer 480, as referenced in FIGS. 5 to 6C, may also apply to the touch wires 830, the light-shielding inclined film 840, the first insulating layer 850, and the buffer layer 880, except for the parts specifically described above.

Figure 12:
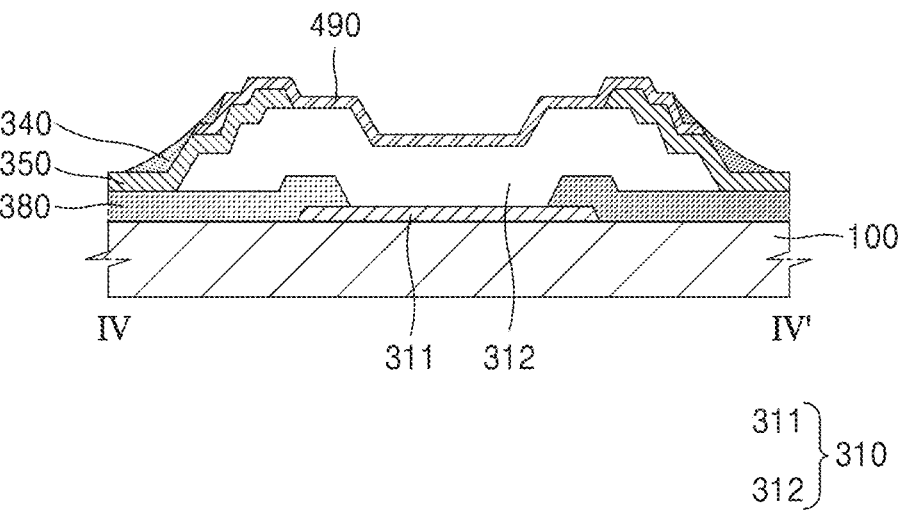
FIG. 12 is a cross-sectional view schematically showing an example of a part of a cross-section IV-IV' of FIG. 1.

FIG. 12 is a cross-sectional view schematically showing an example of a part of a cross-section IV-IV' of FIG. 1.

Referring to FIG. 12, a pad electrode 310 disposed on the substrate 100 may include a first pad electrode 311 and a second pad electrode 312 formed on the first pad electrode 311.

Regions of the first pad electrode 311 and the second pad electrode 312 may directly contact each other, and thus, the first pad electrode 311 and the second pad electrode 312 may be electrically connected to each other.

The first pad electrode 311 may be formed, for example, together with formation of the gate electrode 222. That is, like the gate electrode 222, the first pad electrode 311 may include, for example, Au, Ag, Cu, Ni, Pt, Pd, Al, and Mo and an alloy such as an Al:Nd alloy, a Mo:W alloy, etc., without being limited thereto, and may include various materials considering design conditions.

The second pad electrode 312 may be formed, for example, together with formation of the source electrode 223 and the drain electrode 224. That is, the second pad electrode 312, like the source electrode 223 and the drain electrode 224, may be formed, as a single layer or multiple layers, of one or more of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), etc.

The buffer layer 380 may be disposed between the first pad electrode 311 and the second pad electrode 312. The buffer layer 380 may insulate the first pad electrode 311 from the second pad electrode 312. In some embodiments, the buffer layer 380 may be formed together with formation of the interlayer insulating film 214, and the buffer layer 380 may be formed of an inorganic material such as, for example, SiNx, SiO$_2$, etc., like the interlayer insulating film 214.

The insulating layer 350 may be formed on the buffer layer 380 and the second pad electrode 312. The insulating layer 350 may prevent a short-circuit between a connection wire 490 and the second pad electrode 312. The insulating layer 350 may include an inorganic material or an organic material and may be formed as a single layer or multiple layers.

In some embodiments, the display device 10 may include the display panel DP including the display area DA and the non-display area PA, which is positioned on a side of the display area DA and includes the pad portion 300. The display device 10 may also include the touch screen layer 400 positioned on the display panel DP.

The pad portion 300 may include a plurality of pad electrodes 310, and at least some of the plurality of pad electrodes 310 may be electrically connected to the touch screen layer 400 by the connection wire 490. In some embodiments, each of the plurality of pad electrodes 310 may be electrically connected to a first sensing pattern 410 or a second sensing pattern 420 by the connection wire 490.

The connection wire 490 may include a first metal layer, a third metal layer disposed above the first metal layer, and a second metal layer disposed between the first metal layer and the third metal layer. In some embodiments, a material of the first metal layer and a material of the third metal layer may be the same as each other. The connection wire 490 may be, for example, a Ti/Al/Ti wire.

The light-shielding inclined film 340 may be disposed on a side surface of the connection wire 490 to alleviate and improve a seam defect problem by reducing a reflectance of a wire side without increasing a mask while increasing the thickness of the wire for a low-resistance wire.

The light-shielding inclined film 340 may be disposed on the edge(s) (e.g., side surface(s)) of the connection wire 490 instead of on the upper surface of the connection wire 490. The light-shielding inclined film 340 may be formed on a region of the top portion of the connection wire 490 connected to the side surface of the connection wire 490.

The connection wire 490 may be disposed on the second pad electrode 312 and the insulating layer 350, and the light-shielding inclined film 340 may include an inclined surface extending from the side surface or the top portion of the connection wire 490 to a region on the insulating layer 350. Thus, a seam defect problem may be alleviated and prevented, and the tips of the first metal layer and the third metal layer of the connection wire 490 may be protected.

The description of the light-shielding inclined film 440, with reference to FIGS. 5 to 6C, may also apply to the light-shielding inclined film 340, except for the parts specifically described above.

The display device 10 according to an embodiment may be applied to various electronic devices 1000. An electronic device 1000 according to an embodiment may include the display device 10 described above, and may further include a module or device having additional functions, in addition to the display device 10.

Figure 13:
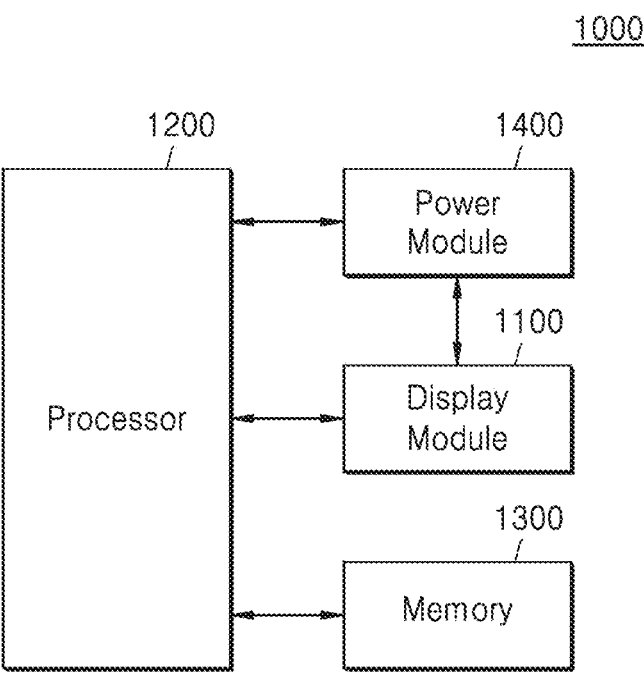
FIG. 13 is a block diagram of an electronic device according to an embodiment.

FIG. 13 is a block diagram of an electronic device according to an embodiment.

Referring to FIG. 13, an electronic device 1000 according to an embodiment may include a display module 1100, a processor 1200, a memory 1300, and a power module 1400.

The processor 1200 may include at least one of, for example, a central processing unit (CPU), an application processor (AP), a graphics processing unit (GPU), a communication processor (CP), an image signal processor (ISP), or a controller.

The memory 1300 may store data information utilized for operation of the processor 1200 or the display module 1100. An image data signal and/or an input control signal may be transmitted to the display module 1100 when the processor 1200 executes an application stored in the memory 1300, and the display module 1100 may output image information through a display screen by processing the received signal.

The power module 1400 may include a power supply module, such as a power adapter or a battery device, and a power conversion module which converts power supplied by the power supply module to generate power utilized for the operation of the electronic device 1000.

At least one of respective components of the electronic device 1000 may be included in the display device 10 according to embodiments described above. In some embodiments, some of the individual modules functionally included in a module may be included in a display device, while others may be provided separately from the display device. For example, the display device 10 may include the display module 1100, and the processor 1200, the memory 1300, and the power module 1400 may be provided in the form of other apparatuses in the electronic device 1000 other than the display device 10.

Figure 14:
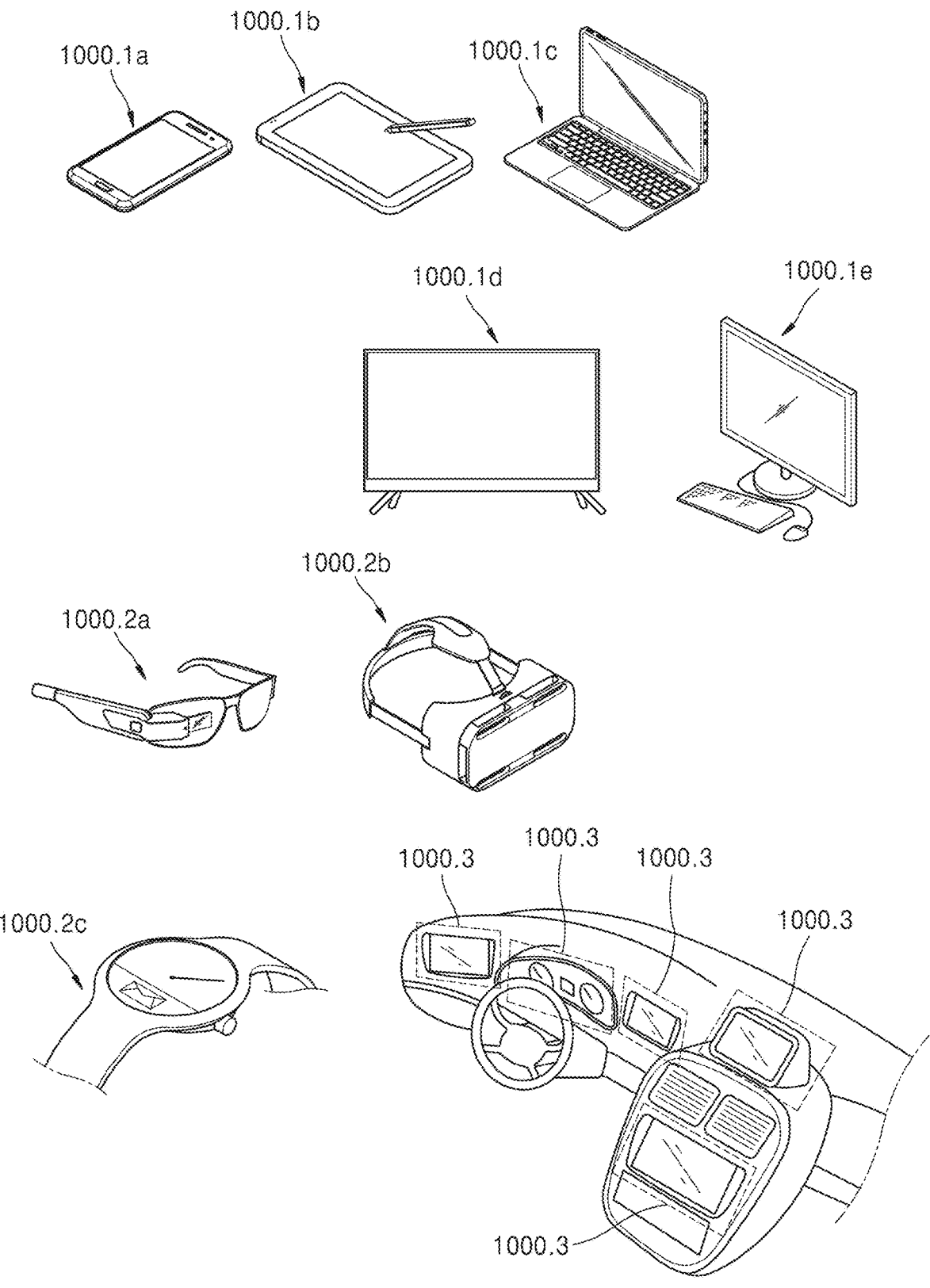
FIG. 14 illustrates schematic views of individual electronic devices according to various embodiments.

FIG. 14 illustrates schematic views of individual electronic devices according to various embodiments.

Referring to FIG. 14, various electronic devices according to embodiments to which the display device 10 is applied may include an electronic device for displaying an image, such as a smartphone 1000.1a, a tablet PC 1000.1b, a laptop computer 1000.1c, a TV set 1000.1d, a desk monitor 1000.1e, and the like, a wearable electronic device including a display module, such as smart glasses 1000.2a, a head mounted display 1000.2b, a smart watch 1000.2c, and the like, and an electronic device 1000.3 for vehicles including a display module, such as a center information display (CID) arranged on an instrument panel, center fascia, or dashboard of a vehicle, a room mirror display, and the like.

Figure 15:
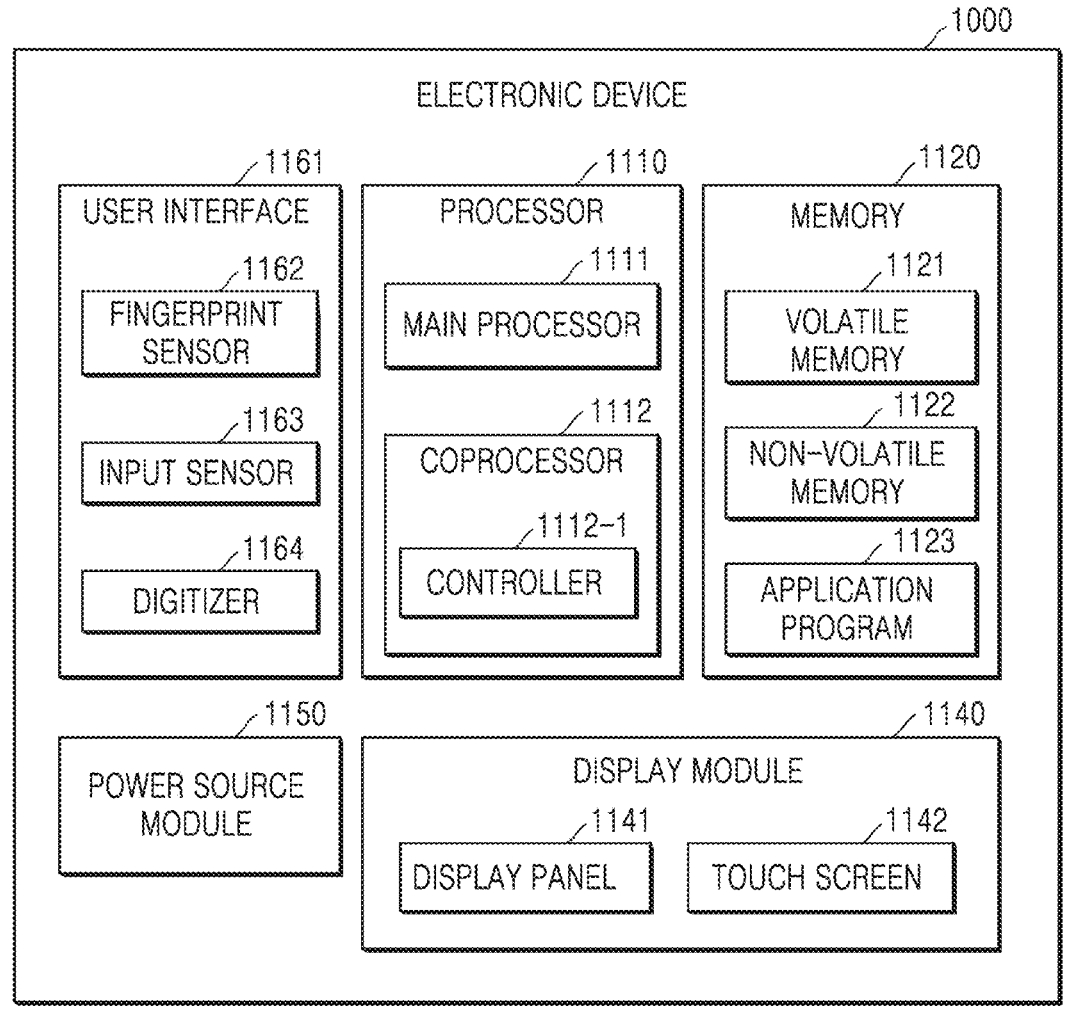
FIG. 15 is a diagram illustrating an electronic device according to an embodiment of the present disclosure.

FIG. 15 is a diagram illustrating an electronic device according to an embodiment of the present disclosure.

Referring to FIG. 15, the electronic device 1000 may include all or some of the components of the electronic device 1000 described with reference to FIG. 13, as well as additional components. The electronic device 1000 according to an embodiment of the present disclosure may output various information (e.g., images, text, music, etc.) through a display module 1140, which, for example, may correspond to the display device 10 described above. When a processor 1110 executes an application stored in a memory 1120, the display module 1140 may provide application information to a user through a display panel 1141.

In some embodiments, the electronic device 1000 may be configured as, for example, a smartphone, camera, smart TV, monitor, smartwatch, tablet, automotive display, or AR/VR headset. For example, the electronic device 1000 may be a smartphone including a touch-sensitive display area DA for interaction and a non-display area NDA including sensors and circuits for enhanced functionality. For example, the electronic device 1000 may be a television or monitor including a large display area DA for high-resolution video playback and a non-display area NDA incorporating driving circuits or connectivity modules for external inputs. For example, the electronic device 1000 may be a smartwatch including a display area DA optimized for compact and high-clarity visuals and a non-display area NDA integrating biometric sensors for health monitoring. In some cases, the electronic device 1000 be an AR/VR headset.

In some embodiments, memory 1120 may store information such as software codes for operating an application program 1123. The application program 1123 may include software designed to execute specific tasks or provide functionality to a user. The application program 1123 may operate under the control of the processor 1110 and utilizes data stored in the memory 1120 to deliver a wide range of features, such as, for example, productivity tools, multimedia streaming and playback, file or mail deliveries or communication services. The application program 1123 interacts seamlessly with the user interface 1161 or touch screen 1142, allowing a user to launch, navigate, and utilize the program through user inputs such as, for example, touch, tap, gesture, or voice interaction.

Upon user selection of an application via touch screen 1142 or user interface 1161, the processor 1110 may execute the application program 1123 corresponding to the selected application retrieved from the memory 1120 to perform functionalities of the application. For example, when a user selects a camera application by tapping the icon (or a camera application icon) presented on the display panel 1141, the processor 1110 activates a camera module. The processor 1110 may transmit image data corresponding to a captured image acquired through the camera module to the display module 1140. The display module 1140 may display an image corresponding to the captured image through the display panel 1141.

In an embodiment, when a user wishes to make a phone call, the user taps the telephone icon displayed on the display module 1140, and the processor 1110 may execute a phone application program stored in the memory 1120. A telephone keypad may be presented on the display panel 1141 for the user to enter a phone number to call.

In an embodiment, the display module 1140 may be integrated into an electronic device 1000, such as, for example, a laptop computer, smart TV, or tablet. A user wishing to access a multimedia streaming application (e.g., to watch a music video or movie) can do so by tapping the corresponding icon. This action activates the application, allowing the user to view the streamed content.

The processor 1110 may include a main processor 1111 and an auxiliary or coprocessor 1112. The main processor 1111 may include a central processing unit (CPU). The main processor 1111 may further include one or more of a graphics processing unit (GPU), a communication processor (CP), and an image signal processor (ISP).

The coprocessor 1112 may include a controller 1112-1. The controller 1112-1 may include an interface conversion circuit and a timing control circuit. The controller 1112-1 may receive an image signal from the main processor 1111, convert the data format of the image signal to match the interface specifications with the display module 1140, and output image data. The controller 1112-1 may output various control signals to drive the display module 1140. For example, the controller 1112-1 may drive the display module 1140 to display the icon on the display screen suitable for selection by a user to cause execution of an application program 1123.

The memory 1120 may store one or more application programs 1123 and various data used by at least one component (for example, the processor 1110 or the user interface 1161) of the electronic device 1000 and input data or output data for commands related thereto. For example, a camera application program, a GPS application program, an augmented reality and virtual reality application program, and other application programs that can be executed by the processor 1110 upon selection of corresponding icons presented on the display screen (or display panel 1141) via the touch screen 1142 or user interface 1161 by the user. In addition, various setting data corresponding to user settings may be stored in the memory 1120. The memory 1120 may include volatile memory 1121 and non-volatile memory 1122.

The display module 1140 may output visual information (images) to the user. The display module 1140 may include the display panel 1141, a gate driver, the source driver, a voltage generation circuit, and a touch screen 1142. The display module 1140 may further include a window, a chassis, and a bracket to protect the display panel 1141. The display module 1140 may include at least a part of the configuration of the display device 10 described above.

The user interface 1161 serves as the interaction medium between a user and the electronic device 1000. The user interface 1161 may detect an input by a part (e.g., finger) of a user's body or an input by a pen or a mouse, and generate an electric signal or data value corresponding to the input. The user interface 1161 includes the fingerprint sensor 1162, the input sensor 1163, and a digitizer 1164.

The fingerprint sensor 1162 may sense a fingerprint for biometric recognition of the user and may also measure one or more biological signals such as, for example, blood pressure, moisture, or body mass.

The input sensor 1163 may sense user interactions including, for example, touch, tap, gesture, motion, spoken command, and eye movement. The input sensor 1163 includes optical sensors for image capture, eye tracking, or motion and gesture detection. Optical sensors may be infrared or semiconductor photodetectors. The input sensor 1163 includes audio and acoustic sensors, which may be MEMS microphones for voice recognition or sound-based interaction. The audio and acoustic sensors can be installed as part of the user interface 1161 or embedded in the display panel 1141.

The digitizer 1164 may generate a data value corresponding to coordinate information of input by a pen or a mouse to control movement of an onscreen cursor. The digitizer 1164 may generate the amount of change in electromagnetic due to the input as the data value. The digitizer may detect an input by a passive pen or transmit and receive data with an active pen or a remote.

At least one of the fingerprint sensor 1162, the input sensor 1163, or the digitizer 1164 may be implemented as a sensor layer formed on the top layer of the display panel 1141 through a continuous process with a process of forming elements (for example, the light emitting element, the transistor, and the like) included in the display panel 1141.

In addition, the user interface 1161 may further include, for example, a gesture sensor, a gyro sensor that senses rotational movements, an acceleration sensor to track translational movement, a grip sensor, a pressure sensor, a proximity sensor, a color sensor, an infrared (IR) emitter and camera sensor for tracking gaze direction and eye movements, a temperature sensor, or a light sensor. For example, the gyro sensor, acceleration sensor, and infrared emitter and camera may be particularly suitable for AR/VR headset functions.

The touch screen 1142 includes touch sensors embedded in semiconductor layers of the display panel 1141 to sense pressure applied to the top layer (screen) of the display panel 1141. The touch sensors can be a capacitive or a resistive type. The touch screen 1142 may serve as the primary interface for the user to select and navigate applications, control, and interact with the electronic device 1000.

The display panel 1141 (or display) may include, for example, a liquid crystal display panel, an organic light emitting display panel, or an inorganic light emitting display panel. However, the type of the display panel 1141 is not particularly limited. The display panel 1141 may be of a rigid type or a flexible type that can be rolled or folded. The display module 1140 may further include a supporter, bracket, heat dissipation member, and the like that support the display panel 1141. The display panel 1141 may include the display device 10 described above.

The power source module 1150 may supply power to the components of the electronic device 1000. The power source module 1150 may include a battery that charges the power source voltage. The battery may include a non-rechargeable primary battery or a rechargeable secondary battery or fuel cell. The power source module 1150 may include a power management integrated circuit (PMIC). The PMIC may supply optimized power to each of the components described above including the display module 1140.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

According to embodiments of the present disclosure, a display device may be implemented which solves a visibility problem on a wire side surface and a sealing defect problem of an insulating layer, without increasing a thickness. However, the scope of the present disclosure is not limited to these effects.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
a substrate;
a pixel layer disposed on the substrate;
an encapsulation layer disposed on the pixel layer;
a touch screen layer disposed on the encapsulation layer,
wherein the touch screen layer comprises a plurality of first sensing patterns arranged in a first direction and a plurality of second sensing patterns arranged in a second direction that is different from the first direction,
each of the plurality of first sensing patterns and each of the plurality of second sensing patterns comprises a plurality of touch wires, and
each of the touch wires comprises a first touch wire and a second touch wire disposed on the first touch wire; and
a light-shielding inclined film disposed on a side surface of the first touch wire and a side surface of the second touch wire; and
a color filter disposed between the touch screen layer and the encapsulation layer; and
a light-shielding member disposed on the touch wires,
wherein the light-shielding inclined film covers the side surface of the first touch wire, and the light-shielding member covers the second touch wire.

2. The display device of claim 1, further comprising:
a first insulating layer disposed between the first touch wire and the second touch wire.

3. The display device of claim 1, wherein the first touch wire and the second touch wire are electrically connected to each other.

4. The display device of claim 1, wherein the light-shielding inclined film comprises a first light-shielding inclined film disposed on the side surface of the first touch wire and a second light-shielding inclined film disposed on the side surface of the second touch wire.

5. The display device of claim 1, wherein the light-shielding inclined film comprises a black pigment.

6. The display device of claim 1, wherein each of the touch wires comprises a first metal layer, a third metal layer disposed on the first metal layer, and a second metal layer disposed between the first metal layer and the third metal layer.

7. The display device of claim 6, wherein the first metal layer and the third metal layer comprise titanium (Ti), and the second metal layer comprises aluminum (Al).

8. The display device of claim 1, further comprising:
a color filter disposed on the touch screen layer; and
a light-shielding member disposed on the color filter and overlapping the touch wires.

9. A display device, comprising:
a display panel comprising a display area and a non-display area,
wherein the non-display area is disposed at a side of the display area and comprises a pad portion;
a touch screen layer disposed on the display panel,
wherein the pad portion comprises a plurality of pad electrodes, and
at least some of the plurality of pad electrodes are electrically connected to the touch screen layer by a connection wire; and
a light-shielding inclined film disposed on a side surface of the connection wire; and
wherein the touch screen layer comprises a plurality of first sensing patterns arranged in a first direction and a plurality of second sensing patterns arranged in a second direction that is different from the first direction, each of the plurality of first sensing patterns and each of the plurality of second sensing patterns comprises a plurality of touch wires; and wherein light-shielding inclined film disposed on a side surface of each of the touch wires, and wherein each of the touch wires comprises a first touch wire and a second touch wire disposed on the first touch wire and electrically connected to the first touch wire; and a color filter disposed between the touch screen layer and the display panel; and a light-shielding member disposed the on the touch wires, and wherein the light-shielding inclined film covers the side surface of the first touch wire, and the light-shielding member covers the second touch wire.

10. The display device of claim 9, wherein the light-shielding inclined film comprises a first light-shielding inclined film disposed on a side surface of the first touch wire and a second light-shielding inclined film disposed on a side surface of the second touch wire.

11. The display device of claim 9, wherein each of the connection wire and each touch wire comprises a first metal layer, a third metal layer disposed on the first metal layer, and a second metal layer disposed between the first metal layer and the third metal layer.

12. The display device of claim 11, wherein the first metal layer and the third metal layer comprise titanium (Ti), and the second metal layer comprises aluminum (Al).

13. The display device of claim 9, wherein the light-shielding inclined film comprises a black pigment.

14. The display device of claim 9, further wherein the color filter disposed on the touch screen layer; and the light-shielding member disposed on the color filter and overlapping the touch wires.

15. An electronic device, comprising:

a processor;

a memory having stored application programs for execution by the processor;

a display device comprising:

a substrate;

a pixel layer disposed on the substrate;

an encapsulation layer disposed on the pixel layer; and a touch screen layer disposed on the encapsulation layer, wherein the touch screen layer comprises a plurality of first sensing patterns arranged in a first direction and a plurality of second sensing patterns arranged in a second direction that is different from the first direction, each of the plurality of first sensing patterns and each of the plurality of second sensing patterns comprises a plurality of touch wires, and each of the touch wires comprises a first touch wire and a second touch wire disposed on the first touch wire; and a light-shielding inclined film disposed on a side surface of the first touch wire and a side surface of the second touch wire; and a color filter disposed between the touch screen layer and the encapsulation layer; and a light-shielding member disposed on the touch wires, wherein the light-shielding inclined film covers the side surface of the first touch wire, and the light-shielding member covers the second touch wire, and a user interface configured to sense user input via touch or cursor select of an icon presented on the display device, wherein the processor is caused to execute one or more of the stored application programs upon receipt of the user input.

\* \* \* \* \*